US009244764B2

(12) United States Patent
D'Abreu et al.

(10) Patent No.: US 9,244,764 B2
(45) Date of Patent: *Jan. 26, 2016

(54) ERROR CORRECTING CODE TECHNIQUES FOR A MEMORY HAVING A THREE-DIMENSIONAL MEMORY CONFIGURATION

(71) Applicant: SANDISK TECHNOLOGIES INC., Plano, TX (US)

(72) Inventors: Manuel Antonio D'Abreu, El Dorado Hills, CA (US); Xinde Hu, San Diego, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/273,005

(22) Filed: May 8, 2014

(65) Prior Publication Data

US 2015/0324251 A1   Nov. 12, 2015

(51) Int. Cl.
G11C 29/00 (2006.01)
G06F 11/10 (2006.01)
G11C 29/42 (2006.01)

(52) U.S. Cl.
CPC ........ *G06F 11/1044* (2013.01); *G06F 11/1072* (2013.01); *G11C 29/42* (2013.01)

(58) Field of Classification Search
CPC .... G11C 29/42; G11C 29/52; G06F 11/1044; G06F 11/1048
USPC .................................. 714/708, 746, 774, 773
See application file for complete search history.

(56) References Cited

U.S. PATENT DOCUMENTS

| 8,737,130 | B2 | 5/2014 | d'Abreu et al. |
| 8,964,476 | B2 | 2/2015 | Shim et al. |
| 2010/0097858 | A1 | 4/2010 | Tokiwa et al. |
| 2010/0332923 | A1 | 12/2010 | d'Abreu et al. |
| 2011/0199833 | A1 | 8/2011 | Shim et al. |
| 2011/0238884 | A1 | 9/2011 | Sutardja |
| 2011/0307758 | A1 | 12/2011 | Fillingim |
| 2012/0069664 | A1 | 3/2012 | Kim et al. |

(Continued)

FOREIGN PATENT DOCUMENTS

WO   2012058328 A1   5/2012

OTHER PUBLICATIONS

Jang, Jaehoon et al. "Vertical Cell Array Using TCAT (Terabit Cell Array Transistor) Technology for Ultra High Density NAND Flash Memory," IEEE, 2009 Symposium on VLSI Technology Digest of Technical Papers, Honolulu, HI, Jun. 16-18, 2009, pp. 192-193.

(Continued)

*Primary Examiner* — Shelly A Chase
(74) *Attorney, Agent, or Firm* — Toler Law Group, PC

(57) ABSTRACT

A data storage device includes a memory having a three-dimensional (3D) memory configuration. A method includes encoding first data to be stored at a first physical page. The first physical page is disposed within the memory at a first distance from a substrate of the memory, and the first data is encoded using a first encoding technique. The method further includes encoding second data to be stored at a second physical page. The second physical page is disposed within the memory at a second distance from the substrate that is greater than the first distance. The second data is encoded using a second encoding technique that is different than the first encoding technique.

20 Claims, 12 Drawing Sheets

(56) References Cited

U.S. PATENT DOCUMENTS

| | | | |
|---|---|---|---|
| 2012/0284589 | A1 | 11/2012 | Kim et al. |
| 2013/0031443 | A1 | 1/2013 | Oh et al. |
| 2013/0042138 | A1 | 2/2013 | Kim et al. |
| 2013/0124932 | A1 | 5/2013 | Schuh et al. |
| 2013/0170297 | A1 | 7/2013 | Nam et al. |
| 2013/0242667 | A1 | 9/2013 | Shim et al. |
| 2014/0059406 | A1* | 2/2014 | Hyun et al. .................. 714/773 |
| 2015/0117118 | A1 | 4/2015 | Shim et al. |

OTHER PUBLICATIONS

Nowak, Etienne et al. "Intrinsic Fluctuations in Vertical NAND Flash Memories," IEEE, 2012 Symposium on VLSI Technology Digest of Technical Papers, Honolulu, HI, Jun. 12-14, 2012, pp. 21-22.

Arya, Pranav "A Survey of 3D NAND Flash Memory," http://Ipsoc.eic.nctu.edu.tw/courses/MS2012Autumn/term/Report/3D%20Nand%20Flash%20Memory%20-%20PranavArya(0160814).pdf, Mar. 19, 2013, 11 pages.

Walker, Andrew J. "A Rigorous 3-D NAND Flash Cost Analysis," IEEE Transactions on Semiconductor Manufacturing, vol. 26, No. 4, Nov. 2013, pp. 619-625.

D'Abreu, Manuel Antonio et al. "Memory Access Techniques for a Memory Having a Three-Dimensional Memory Configuration," U.S. Appl. No. 14/272,951, filed May 8, 2014, 75 pages.

D'Abreu, Manuel Antonio et al. "Structure Variation Detection for a Memory Having a Three-Dimensional Memory Configuration," U.S. Appl. No. 14/273,031, filed May 8, 2014, 74 pages.

Non-Final Office Action mailed Aug. 1, 2014 in U.S. Appl. No. 14/272,951, 7 pages.

Notice of Allowance and Fee(s) Due mailed Aug. 22, 2014 in U.S. Appl. No. 14/273,031, 8 pages.

Notice of Allowance and Fee(s) Due mailed Dec. 9, 2014 in U.S. Appl. No. 14/273,031, 7 pages.

International Search Report and Written Opinion of the International Searching Authority (EPO) for International Application No. PCT/US2015/027075, mailed Aug. 4, 2015, 13 pages.

Non-Final Office Action mailed Feb. 27, 2015 in U.S. Appl. No. 14/272,951, 10 pages.

International Search Report and Written Opinion of the International Searching Authority (EPO) for International Application No. PCT/US2015/027090, mailed Jul. 8, 2015, 11 pages.

International Search Report and Written Opinion of the International Searching Authority (EPO) for International Application No. PCT/US2015/027082, mailed Jul. 8, 2015, 10 pages.

* cited by examiner

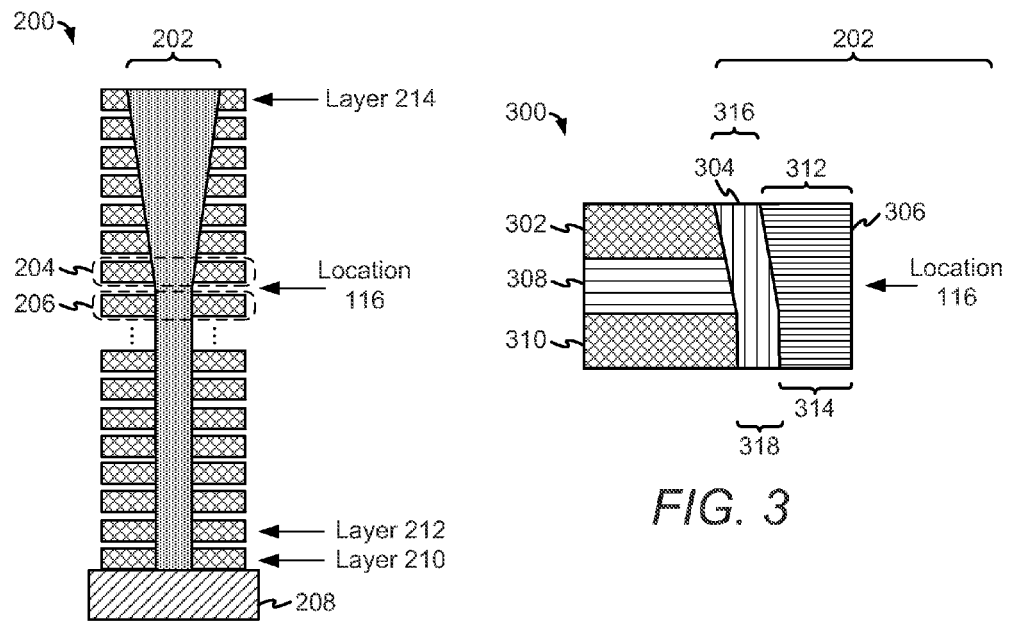
FIG. 2
FIG. 3
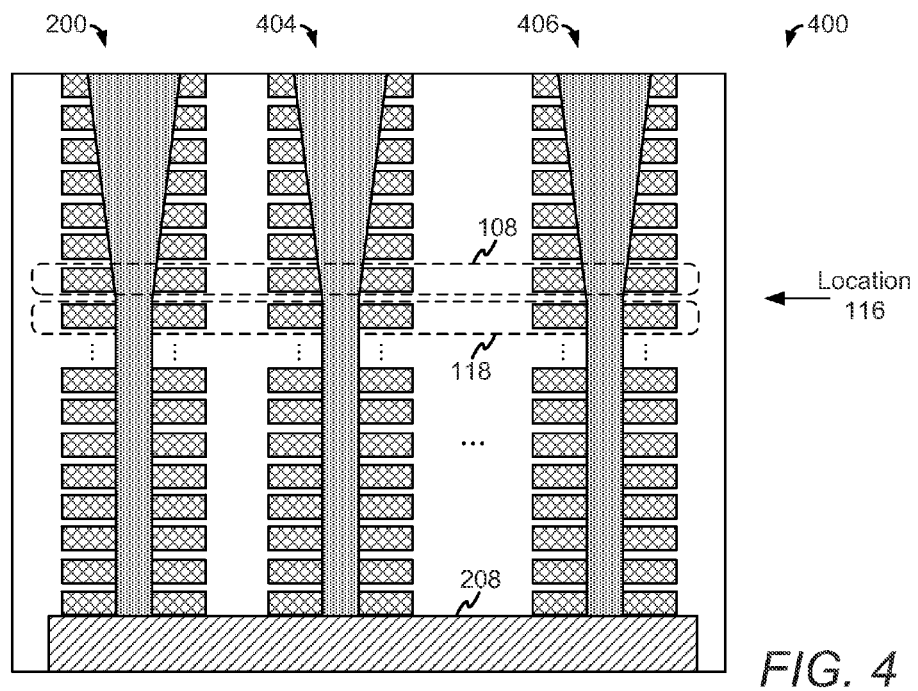
FIG. 4

ERROR CORRECTING CODE TECHNIQUES FOR A MEMORY HAVING A THREE-DIMENSIONAL MEMORY CONFIGURATION

CROSS-REFERENCE TO RELATED APPLICATIONS

This application is related to U.S. patent application Ser. No. 14/273,031, filed May 8, 2014 and entitled "STRUCTURE VARIATION DETECTION FOR A MEMORY HAVING A THREE-DIMENSIONAL MEMORY CONFIGURATION", and is further related to U.S. patent application Ser. No. 14/272,951, filed May 8, 2014 and entitled "MEMORY ACCESS TECHNIQUES FOR A MEMORY HAVING A THREE-DIMENSIONAL MEMORY CONFIGURATION", each disclosure of which is incorporated herein by reference in its entirety.

FIELD OF THE DISCLOSURE

The present disclosure is generally related to memories and more particularly to memories having a three-dimensional memory configuration.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. Consequently, flash memory devices enable users to store and access a large amount of data. As a number of bits stored per cell increases, bit errors in stored data typically increase. A data storage device may encode and decode data using an error correcting code (ECC) technique to correct certain bit errors in data. The ECC technique may utilize parity information that decreases data storage capacity for other information, such as user data.

To further increase data storage capacity, a memory may have a three-dimensional memory configuration. A three-dimensional memory may include multiple layers of storage elements that are "stacked" relative to a semiconductor substrate. Depending on the particular implementation, each layer of a three-dimensional memory may operate similarly to a two-dimensional (or "planar") memory. A three-dimensional memory fabrication process typically includes different fabrication steps than a two-dimensional memory fabrication process. For example, a three-dimensional memory fabrication process may connect layers of storage elements to form a column of storage elements.

SUMMARY

A data storage device may include a memory having a three-dimensional (3D) memory configuration. To fabricate the memory, multiple layers of storage elements may be formed on a substrate, and a region (e.g., a "memory hole") may be etched through the multiple layers. The region may be filled (e.g., with a charge trap material and a channel material) to form a structure that connects layers of storage elements of the memory. Depending on the particular etch process and the number of layers formed on the substrate, the region may have a "tapered" profile. To illustrate, if the etch process begins at a "top" layer and etches down to reach a "bottom" layer, then the top layer may be subject to the etch process for a greater time duration than the bottom layer. Because more etching is performed to reach "down" to the bottom layer relative to the top layer, the region may have a variation, such as a "tapered" profile. As a result, a first portion of the structure that is nearer to the substrate may have a narrower width relative to a second portion of the structure that is farther from the substrate than the first portion. Such tapering can affect device performance, such as performance characteristics of storage elements connected to the structure.

The data storage device may include a controller that is configured to determine a location of the variation of the structure. The location may correspond to a portion of the structure where "tapering" of the structure begins. To illustrate, within a particular distance above the substrate of the memory, the structure may be approximately uniform in width. At a greater distance from the substrate, the structure may begin to "taper." The controller may measure a first parameter associated with a first layer of storage elements and a second parameter associated with a second layer of storage elements. Based on a difference between the first parameter and the second parameter, the controller may detect a variation between the first layer and the second layer (or that a "taper" effect occurs approximately at the location).

An error correcting code (ECC) parameter table may be determined based on the location of the variation. The ECC parameter table may indicate a first parameter associated with a first set of physical pages of storage elements formed below the location within the memory and may further indicate a second parameter associated with a second set of physical pages of storage elements formed above the location within the memory. The first parameter may indicate a first ECC technique associated with the first set of physical pages, and the second parameter may indicate a second ECC technique associated with the second set of physical pages. In an illustrative example, data stored at the first set of physical pages is encoded using a polynomial-based encoding technique, such as a Bose-Chaudhuri-Hocquenghem (BCH) encoding technique. Data stored at the second set of physical pages may be encoded using a probabilistic-based encoding technique, such as a low-density parity check (LDPC) encoding technique or a turbo encoding technique.

Alternatively or in addition to the ECC parameter table, a memory access parameter table may be determined based on the location of the variation. The memory access parameter table may specify write parameters and/or read parameters for accessing the memory. To illustrate, the memory access parameter table may indicate a first parameter associated with a first set of physical pages of storage elements formed below the location within the memory and may further indicate a second parameter associated with a second set of physical pages of storage elements formed above the location within the memory. In an illustrative example, data stored at the first set of physical pages is programmed using a first programming voltage indicated by the first parameter. Data stored at the second set of physical pages may be programmed using a second programming voltage indicated by the second parameter. Alternatively or in addition, the first parameter and the second parameter may indicate a number of programming pulses, a duration of the programming pulses, another write parameter, a read parameter (e.g., a read voltage), or a combination thereof.

BRIEF DESCRIPTION OF THE DRAWINGS

FIGS. 2-5 illustrate example structures that can be implemented within the memory of the data storage device of FIG. 1;

FIG. 6 illustrates a particular illustrative example of a table indicating locations of variations of a structure of the memory of the data storage device of FIG. 1;

DETAILED DESCRIPTION

Figure 1:
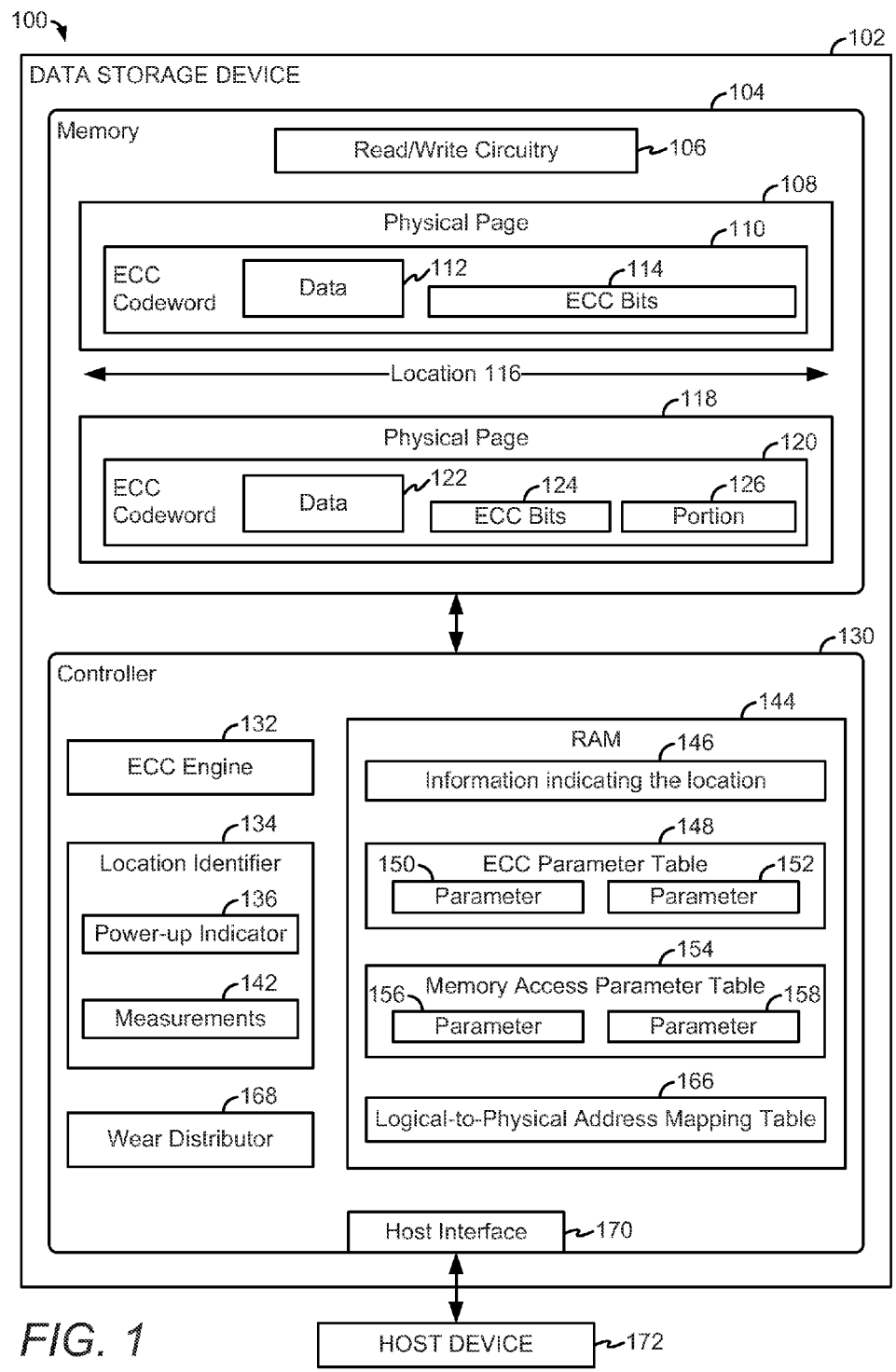
FIG. 1 is a block diagram of a particular illustrative embodiment of a system including a data storage device that includes a memory having a three-dimensional memory configuration.

Referring to FIG. 1, a particular illustrative embodiment of a system is depicted and generally designated 100. The system 100 includes a data storage device 102 and a host device 172. The data storage device 102 and the host device 172 may be coupled via a connection, such as a wireless connection or a bus. The data storage device 102 may be embedded within the host device 172, such as in accordance with a Joint Electron Devices Engineering Council (JEDEC) Solid State Technology Association Universal Flash Storage (UFS) configuration. Alternatively, the data storage device 102 may be removable from the host device 172 (i.e., "removably" coupled to the host device 172). As an example, the data storage device 102 may be removably coupled to the host device 172 in accordance with a removable universal serial bus (USB) configuration. In an illustrative implementation, the data storage device 102 corresponds to a solid-state drive (SSD) that is integrated within an electronic device, such as the host device 172.

The data storage device 102 may include a memory 104. The memory 104 may be a non-volatile memory, such as a NAND flash memory, as an illustrative example. The memory 104 may have a multi-layer memory configuration, such as a three-dimensional (3D) memory configuration. As an illustrative example, the memory 104 may include one or more layers having a first orientation and may further include one or more elements, such as vertical columns, having a second orientation perpendicular to (or approximately perpendicular to) the first orientation to enable cross-layer coupling of storage elements of the one or more layers. In a particular implementation, the memory 104 is a non-volatile memory having a three-dimensional (3D) memory configuration that is monolithically formed in physical levels of arrays of memory cells having an active area disposed above a silicon substrate.

The memory 104 may include read/write circuitry 106, a physical page 108, and a physical page 118. The data storage device 102 includes circuitry that is associated with operation of memory cells of the memory 104. The circuitry may correspond to the read/write circuitry 106, as an illustrative, non-limiting example.

The physical pages 108, 118 may be included in a block (e.g., an erase group) of the memory 104. The memory 104 may include multiple blocks of physical pages, and each block may include multiple physical pages. Although FIG. 1 depicts that the memory 104 includes two physical pages (i.e., the physical pages 108, 118), it should be appreciated that the memory 104 may have another configuration. For example, the memory 104 may include another number of physical pages (e.g., more than two physical pages).

The physical pages 108, 118 may each be configured to store threshold voltages indicating one or more pages of data. To illustrate, one or more of the physical pages 108, 118 may correspond to a physical page of single-level cell (SLC) storage elements that can be programmed to store threshold voltages indicating bit values of a page, such as in connection with a one-bit-per-cell ("X1") configuration. One or more of the physical pages 108, 118 may correspond to a physical page of multi-level cell (MLC) storage elements that can be programmed to store threshold voltages indicating bit values of multiple pages, such as in connection with a two-bit-per-cell ("X2") configuration or a three-bit-per-cell ("X3") configuration, as illustrative examples.

The data storage device 102 may further include a controller 130 that is operationally coupled to the memory 104. The memory 104 and the controller 130 may be operationally coupled via a connection, such as a bus. The memory 104 may be included on a memory die that is separate from the controller 130 and that is coupled to the controller 130. In one or more other implementations, the memory 104 and the controller 130 may be included on a common die. FIG. 1 illustrates that the controller 130 may include an error correcting code (ECC) engine 132, a location identifier 134, a random access memory (RAM) 144, a wear distributor 168, and a host interface 170.

The ECC engine 132 is configured to generate one or more ECC codewords using one or more ECC encoding techniques. The ECC engine 132 may include one or more encoders, such as a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC techniques, or a combination thereof. The ECC engine 132 may include one or more decoders configured to decode data read from the memory 104 to detect and correct, up to an error correction capability of the ECC scheme, one or more bit errors that may be present in the data.

The location identifier 134 may include a power-up indicator 136. The location identifier 134 may determine one or more measurements, such as measurements 142. The measurements 142 may be stored at the controller 130, at the memory 104, at another location, or a combination thereof.

The controller 130 is configured to send data and commands to the memory 104 and to receive data from the memory 104. For example, the controller 130 is configured to send data and a write command to cause the memory 104 to store the data to a specified address of the memory 104. The controller 130 is configured to send a read command to read data from a specified address of the memory 104.

The data storage device 102 is configured to receive data and instructions from the host device 172 and to send data to the host device 172. For example, the controller 130 may send data to the host device 172 via the host interface 170 and may receive data from the host device 172 via the host interface 170.

The host device 172 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 172 may communicate via a host controller, which may enable the host device 172 to communicate with the data storage device 102. The host device 172 may operate in compliance with a JEDEC Solid State Technology Association industry specification, such as an embedded MultiMedia Card (eMMC) specification or a Universal Flash Storage (UFS) Host Controller Interface specification. The host device 172 may operate in compliance with one or more other specifications, such as a Secure Digital (SD) Host Controller specification, as an illustrative example.

Alternatively, the host device 172 may communicate with the data storage device 102 using another communication protocol.

During a first mode of operation of the data storage device 102, the controller 130 may be configured to determine a location associated with a variation of a structure that extends through multiple layers of the memory 104. The structure may include a channel region and a charge trap region that are formed within an etched region (e.g., a "memory hole"). The structure may extend through multiple layers of the memory 104 to connect physical pages of the memory 104, such as the physical pages 108, 118. The variation may correspond to a "tapering" of the structure, as described further with reference to FIGS. 2-5. In the example of FIG. 1, a location 116 is associated with a variation of a structure that extends through multiple layers of the memory 104. The location 116 may correspond to a distance within the memory 104 from a surface of a substrate of the memory 104 (i.e., the distance may define the location 116 because the location 116 is separated from the surface of the substrate by the distance).

The location identifier 134 may determine the location 116 by measuring a first parameter at the physical page 118 and by measuring a second parameter at the physical page 108. To illustrate, the location identifier 134 may send one or more control signals to the read/write circuitry 106 to cause the read/write circuitry 106 to program a first storage element of the physical page 118 to a particular state and to cause the read/write circuitry 106 to program a second storage element of the physical page 108 to the particular state, such as a particular threshold voltage. The particular state may correspond to an "A" state (e.g., a threshold voltage indicating one or more bit values, such as a "0" bit value), as an illustrative example. The particular state may correspond to a "B" state or a "C" state (e.g., a first threshold voltage indicating a first bit sequence or a second threshold voltage indicating a second bit sequence) in connection with an illustrative MLC implementation, as additional illustrative examples.

The location identifier 134 may be responsive to the read/write circuitry 106 to determine the first parameter and the second parameter. For example, the location identifier 134 may be configured to determine a first number of programming pulses used by the read/write circuitry 106 to program the first storage element to the particular state and further to determine a second number of programming pulses used by the read/write circuitry 106 to program the second storage element to the particular state. In this example, the first parameter indicates the first number of programming pulses, and the second parameter indicates the second number of programming pulses. Alternatively or in addition, the first parameter and the second parameter may indicate one or more other parameters (e.g., a programming voltage of the programming pulses, a pulse duration (or "width") of the programming pulses, another parameter, or a combination thereof).

The location identifier 134 may compare the first parameter and the second parameter. For example, the location identifier 134 may determine a difference between the first parameter and the second parameter, such as by subtracting the first parameter from the second parameter. If the difference between the first parameter and the second parameter exceeds a threshold, the location identifier 134 may detect a variation of a structure that connects physical pages. In the example of FIG. 1, the variation is between the physical pages 108, 118 (i.e., at the location 116). The location identifier 134 may detect the variation during testing of the memory 104 (e.g., "at the factory"), as an illustrative example.

To further illustrate, in a particular embodiment, the location identifier 134 identifies the location 116 in response to an initial power-up of the data storage device. As an illustrative example, the controller 130 may access the power-up indicator 136 in response to each power-up of the data storage device 102. In a particular embodiment, the data storage device 102 includes a power-up detector (not shown in FIG. 1) that is configured to detect that power is being received at the data storage device 102 (e.g., from the host device 172).

A first value of the power-up indicator 136 may indicate that the data storage device 102 has not been previously powered up (i.e., the current power-up is an initial power-up of the data storage device 102). In this case, the controller 130 may perform operations to determine (or attempt to determine) one or more locations of variations of structures extending through multiple layers of the memory 104. After performing the operations (e.g., after determining the location 116), the controller 130 may adjust the power-up indicator 136 from the first value to a second value to indicate that the data storage device has been powered up. Although the example of FIG. 1 illustrates that the power-up indicator 136 is stored at the location identifier 134, it should be appreciated that the power-up indicator 136 may be stored at another location, such as at the memory 104.

In response to determining the location 116, the controller 130 may generate information 146 that indicates the location 116. The information 146 may be stored (e.g., cached) at the RAM 144, as illustrated in FIG. 1. Alternatively or in addition, the information 146 may be stored at the memory 104. As described further with reference to FIG. 6, the information 146 may correspond to a table. In a particular illustrative embodiment, the controller 130 is configured to utilize the information 146 to determine one or more operating parameters for the memory 104. For example, the controller 130 may assign one or more sets of parameters to the physical page 108 and may assign one or more sets of parameters to the physical page 118.

To further illustrate, the controller 130 may generate an ECC parameter table 148 in response to determining the location 116. The ECC parameter table 148 may assign a parameter 150 to one or more physical pages, such as the physical page 118, of the memory 104 that are located below the location 116 relative to a substrate of the memory 104. As another example, the controller 130 may assign a parameter 152 to one or more physical pages, such as the physical page 108, of the memory 104 that are disposed above the location 116 relative to the substrate. The ECC engine 132 may operate in accordance with the parameters 150, 152. For example, the parameter 150 may specify a first encoding technique for encoding data to be stored at the physical page 118, and the parameter 152 may specify a second encoding technique for data to be stored at the physical page 108. In an illustrative embodiment, the controller 130 is configured to generate the ECC parameter table 148 in response to an initial power-up of the data storage device 102.

As another example, the controller 130 may generate a memory access parameter table 154 in response to determining the location 116. The memory access parameter table 154 may indicate one or more memory access parameters. For example, the memory access parameter table 154 may indicate one or more parameters for writing data to the memory 104 by the read/write circuitry 106, one or more parameters for sensing data from the memory 104 by the read/write circuitry 106, or a combination thereof.

To illustrate, the memory access parameter table 154 may include a write parameter table that specifies a parameter 156 for writing data to physical pages of the memory 104 that are disposed below the location 116 relative to the substrate of the memory 104. The write parameter table may further indicate a parameter 158 associated with physical pages of the memory 104 that are disposed above the location 116 relative to the substrate. For example, the parameter 156 may be associated with the physical page 118, and the parameter 158 may be associated with the physical page 108. In a particular embodiment, the parameter 156 indicates a write voltage for writing data to physical pages of the memory 104 that are disposed below the location 116, and the parameter 158 indicates a second write voltage for writing data to physical pages located above the location 116. In an illustrative embodiment, the controller 130 is configured to generate the write parameter table in response to an initial power-up of the data storage device 102.

Alternatively or in addition, the memory access parameter table 154 may indicate a read parameter table. In this case, the parameter 156 (or another parameter) may indicate a read parameter associated with physical pages of the memory 104 that are disposed below the location 116 relative to the substrate of the memory 104. For example, the parameter 156 may be associated with the physical page 118. The parameter 158 (or another parameter) may indicate a read parameter associated with physical pages of the memory 104 that are disposed above the location 116 relative to the substrate of the memory 104. For example, the parameter 158 may be associated with the physical page 108. In an illustrative embodiment, the controller 130 is configured to generate the read parameter table in response to an initial power-up of the data storage device 102.

During a second mode of operation of the data storage device 102, data may be written to and accessed from the memory 104 using the information 146, the ECC parameter table 148, the memory access parameter table 154, or a combination thereof. The controller 130 may receive data from the host device 172 to be stored at the memory 104. For example, the controller 130 may receive a first request for write access to the memory 104 from the host device 172. The first request may include first data to be stored at the memory 104. After receiving the first request from the host device 172, the controller 130 may receive a second request for write access to the memory 104 from the host device 172. The second request may include second data to be stored at the memory 104. In this case, the first data may correspond to a first file (e.g., an audio file, an image file, a video file, or another file), and the second data may correspond to a second file. In another example, the first data and the second data may be included in a single request received from the host device 172, and the first data and the second data may correspond to a single file to be stored at the memory 104.

In response to receiving data from the host device 172, the controller 130 may access a logical-to-physical address mapping table 166 to determine physical pages of the memory 104 at which to store the data. As a particular example, the controller 130 may access the logical-to-physical address mapping table 166 to determine a first physical address of the memory 104 associated with the first data received from the host device 172. The controller 130 may access the logical-to-physical address mapping table 166 to determine a second physical address of the memory 104 associated with the second data received from the host device 172. In an illustrative example, the first physical address corresponds to the physical page 118, and the second physical address corresponds to the physical page 108.

After accessing the logical-to-physical address mapping table 166, the controller 130 may access the ECC parameter table 148 to determine one or more encoding techniques to encode the first data and the second data. For example, if the controller 130 receives first data that is to be stored at the physical page 118, the controller 130 may access the ECC parameter table 148 to determine that the parameter 150 indicates that the first data is to be encoded using a first encoding technique. As another example, the controller 130 may access the ECC parameter table 148 to determine that second data to be stored at the physical page 108 is to be encoded using a second encoding technique that is different than the first encoding technique. In an illustrative embodiment, the first encoding technique is associated with a lower complexity and/or a higher code rate than the second encoding technique. To illustrate, the first encoding technique may be a polynomial-based encoding technique, such as a BCH encoding technique. The second encoding technique may be a probabilistic-based encoding technique, such as an LDPC encoding technique or a turbo code encoding technique, as illustrative examples. A BCH technique may have lower decoding complexity and faster decoding operation compared to an LDPC technique and a turbo code technique and may be advantageous for data with lower error rates. An LDPC technique or turbo code technique may have higher error correction capability relative to a BCH technique and may be advantageous for data with higher error rates. It should be appreciated that the particular ECC schemes (e.g., BCH, LDPC, turbo code, etc.) are provided for illustration and that the particular ECC scheme may be selected based on the application.

The controller 130 may selectively adjust the ECC engine 132 to encode the first data using the first encoding technique and may selectively adjust the ECC engine 132 to encode the second data using the second encoding technique. To illustrate, in some implementations, the ECC engine 132 includes multiple encoders including a first encoder and a second encoder. The first encoder may be configured to encode data using a polynomial-based encoding technique, and the second encoder may be configured to encode data using a probabilistic-based encoding technique. The first encoder may be configured to encode data using a BCH encoding technique, and the second encoder may be configured to encode data using an LDPC encoding technique or a turbo code encoding technique, as illustrative examples.

The controller 130 may selectively input the first data to the first encoder and the second data to the second encoder. In this example, the controller 130 may selectively activate and deactivate the first encoder and the second encoder. For example, the second encoder may be deactivated (e.g., powered down) while the first encoder encodes the first data, and the first encoder may be deactivated (e.g., powered down) while the second encoder encodes the second data.

In one or more other implementations, the ECC engine 132 may include a common encoder configured to selectively encode data using the first encoding technique or the second encoding technique. To illustrate, the controller 130 may send an encoder enable signal to the ECC engine 132 to adjust a mode of operation of the common encoder from the first encoding technique to the second encoding technique (or vice versa). A first value of the encoder enable signal may select the first encoding technique, and a second value of the encoder enable signal may select the second encoding technique.

The controller 130 may input the first data to the ECC engine 132. The ECC engine 132 may encode the first data using the first encoding technique to generate an ECC codeword 120. The controller 130 may further input the second data to the ECC engine 132. The ECC engine 132 may encode the second data using the second encoding technique to generate an ECC codeword 110.

The ECC codeword 120 may include data 122 (e.g., the first data), ECC bits 124, and a portion 126. The ECC codeword 110 may include data 112 (e.g., the second data) and ECC bits 114. The ECC codeword 120 may be stored at the physical page 118, and the ECC codeword 110 may be stored at the physical page 108. The ECC bits 114, 124 may include parity bits to enable the ECC engine 132 to correct one or more bit errors in the data 112, 122. Although the example of FIG. 1 illustrates that the ECC codewords 110, 120 include separate groups of data and ECC bits for purposes of illustration, it should be appreciated that a particular ECC scheme may generate an ECC codeword that does not include separate groups of data and ECC bits.

In a particular embodiment, "short" ECC codewords having a first number of ECC bits are stored to physical pages of the memory 104 that are below the location 116, and "extended" ECC codewords having a second number of ECC bits are stored to physical pages of the memory 104 that are above the location 116. In this example, the second number of ECC bits is greater than the first number of ECC bits, such as to compensate for reduced data reliability caused by a "taper" effect associated with physical pages above the location 116. As a non-limiting, illustrative example, the first number may correspond to 100 bytes, and the second number may correspond to 200 bytes. In the example of FIG. 1, the portion 126 may include a "padded" portion (e.g., zero-padded portion) that accounts for the "unused" ECC portion of the ECC codeword 120. To further illustrate using the foregoing example, the ECC bits 114 may include 200 bytes, the ECC bits 124 may include 100 bytes, and the portion 126 may include 100 bytes of non-ECC bits (e.g., a sequence of zero bits). Alternatively, the portion 126 may store other information. For example, the portion 126 may store measurements generated by the location identifier 134 (e.g., the measurements 142), other information, or a combination thereof.

Alternatively or in addition to using the ECC parameter table 148, the data storage device 102 may write data to the memory 104 based on a write parameter table indicated by the memory access parameter table 154. For example, the read/write circuitry 106 may write the ECC codeword 120 to the physical page 118 based on the parameter 156, and the read/write circuitry 106 may write the ECC codeword 110 to the physical page 108 based on the parameter 158. Depending on the particular implementation, one or both of the parameters 156, 158 may indicate a number of programming pulses, a pulse duration (or "width") of the programming pulses, a programming voltage of the programming pulses, or a combination thereof. To illustrate, the second number of programming pulses may be greater than the first number of programming pulses to compensate for a variation of a structure occurring at the location 116 that causes threshold voltages programmed above the location 116 using a certain number of programming pulses to be less than threshold voltages programmed below the location 116 using the number of programming pulses.

Alternatively or in addition, the data storage device 102 may be configured to sense data using the memory access parameter table 154, such as in response to receiving one or more requests for read access from the host device 172 for data stored at the memory 104. To further illustrate, the controller 130 may receive a first request for read access to the memory 104 from the host device 172. The first request may indicate that the data 122 is to be accessed from the memory 104. The first request may indicate a first logical address associated with the data 122. After receiving the first request from the host device 172, the controller 130 may receive a second request for read access to the memory 104 from the host device 172. The second request may indicate that the data 112 is to be accessed from the memory 104. The second request may indicate a second logical address associated with the data 112. Alternatively, the host device 172 may send a single request to the controller 130 requesting read access to the data 112, 122.

The controller 130 may access the logical-to-physical address mapping table 166 to determine physical addresses associated with the data 112, 122. For example, the controller 130 may access the logical-to-physical address mapping table 166 to identify a first physical address of the physical page 108 based on the first logical address and to further identify a second physical address of the physical page 118 based on the second logical address.

The data storage device 102 may be configured to access the ECC codewords 110, 120 from the physical pages 108, 118 based on one or more read parameters indicated by the memory access parameter table 154. For example, the read/write circuitry 106 may be responsive to the controller 130 to sense the physical page 118 using a first read voltage indicated by the parameter 156. As another example, the read/write circuitry 106 may be responsive to the controller 130 to access the physical page 108 using a second read voltage indicated by the parameter 158. In a particular embodiment, the parameter 156 indicates a first set of threshold voltages for sensing data from physical pages below the location 116 (e.g., the physical page 108). The parameter 158 may indicate a second set of threshold voltages for sensing data from physical pages above the location 116 (e.g., the physical page 118). To illustrate, the second set of threshold voltages may be different than the first set of threshold voltages to compensate for a variation of a structure occurring at the location 116 that causes threshold voltages programmed above the location 116 using a particular number of programming pulses to be less than threshold voltages programmed below the location 116 using the number of programming pulses. In this example, distributions of threshold voltages stored at the physical page 108 may be different than (e.g., less than) distributions of threshold voltages stored at the physical page 118, resulting in read levels that do not "align" with distributions of threshold voltages actually stored at the physical page 108 (and potentially resulting in a high error rate of read data). By adjusting read voltages of the read/write circuitry 106 based on the location 116, read performance is improved by sensing storage elements of the physical page 108 using read levels that are more closely based on (e.g., "matched" to) threshold voltages stored at the physical page 108.

The controller 130 may access the ECC parameter table 148 to determine one or more encoding techniques to decode the data 112, 122. For example, the controller 130 may access the parameter 150 to determine that the ECC codeword 120 is encoded using a first encoding technique and/or that the ECC codeword 120 is to be decoded using a first decoding technique that corresponds to the first encoding technique. As another example, the controller 130 may access the parameter 152 to determine that the ECC codeword 110 is encoded using a second encoding technique and/or that the ECC codeword 110 is to be decoded using a second decoding technique that corresponds to the second encoding technique. The first decoding technique may be a polynomial-based decoding technique, such as a BCH-based decoding technique. The second decoding technique may be a probabilistic-based decoding technique, such as an LDPC-based decoding technique or a turbo code-based decoding technique, as illustrative examples. The second decoding technique may be an iterative decoding technique. For example, an LDPC-based decoding technique may include iteratively updating check nodes and variable nodes at the ECC engine 132.

The controller 130 may selectively adjust the ECC engine 132 to decode the ECC codeword 120 using the first decoding technique to decode the ECC codeword 110 using the second decoding technique. To illustrate, in some implementations, the ECC engine 132 includes multiple decoders including a first decoder and a second decoder. The first decoder may be configured to decode data using a polynomial-based decoding technique, and the second decoder may be configured to decode data using a probabilistic-based decoding technique. The first decoder may be configured to decode data using a BCH-based decoding technique, and the second decoder may be configured to decode data using an LDPC-based decoding technique or a turbo code-based decoding technique, as illustrative examples.

The controller 130 may selectively input the ECC codeword 120 to the first decoder and the ECC codeword 110 to the second decoder. In this example, the controller 130 may selectively activate and deactivate the first decoder and the second decoder. For example, the second decoder may be deactivated (e.g., powered down) while the first decoder decodes the ECC codeword 120, and the first decoder may be deactivated (e.g., powered down) while the second decoder decodes the ECC codeword 110.

In one or more other implementations, the ECC engine 132 may include a common decoder configured to selectively decode an ECC codeword using the first decoding technique or the second decoding technique. To illustrate, the controller 130 may send a decoder enable signal to the ECC engine 132 to change a mode of operation of the common decoder from the first decoding technique to the second decoding technique (or vice versa). A first value of the decoder enable signal may select the first decoding technique, and a second value of the decoder enable signal may select the second decoding technique.

The ECC engine 132 may decode the ECC codewords 110, 120 using the ECC bits 114, 124 to detect and correct, up to an error correction capability of the one or more decoding techniques, one or more bit errors that may be present in the data 112, 122. The controller 130 may send the data 112, 122 to the host device 172 via the host interface 170.

The example techniques described with respect to FIG. 1 enable improved accuracy of ECC operations (e.g., encoding and decoding operations) and/or memory access operations (e.g., read and write operations) at the data storage device 102. For example, by selectively performing encoding operations, write operations, read operations, and/or decoding operations at the data storage device 102 based on the location 116, the data storage device 102 may compensate for one or more effects of a variation of a structure that is connected to the physical pages 108, 118. FIG. 2 describes an example variation of a structure.

Referring to FIG. 2, a particular illustrative embodiment of a column is depicted and generally designated 200. The column 200 may be integrated within a memory having a three-dimensional (3D) memory configuration. For example, the column 200 may be integrated within the memory 104 of FIG. 1.

The column 200 includes storage elements formed within multiple layers of materials that are formed on a substrate 208 (e.g., a silicon substrate). To illustrate, FIG. 2 depicts a layer 210, a layer 212, and a layer 214. The layer 210 may be formed adjacent to the substrate 208 (i.e., the layer 210 may be a "bottom" layer). The layer 212 may be adjacent to the layer 210. The layer 214 may be farther from the substrate than other layers of the column 200 (i.e., the layer 214 may be a "top" layer). The layers 210, 212, and 214 may include a conductive (or semiconductive) material, such as doped polysilicon, as an illustrative, non-limiting example. The column 200 may include other layers, such as an oxide layer interposed between the layers 210, 212, as an illustrative example.

The column 200 may further include a structure 202. To form the structure 202, an etch process may be performed to etch through layers of the column 200 to form an etched region (e.g., a cavity, such as a "memory hole"). After etching through layers of the column 200 to form the etched region, the etched region may be filled with one or more materials to form the structure 202. The structure 202 may have a circular or substantially circular shape (e.g., a cross section of the structure 202 that is perpendicular to a surface of the substrate 208 may be circular).

The column 200 may further include multiple storage elements, such as a storage element 204 and a storage element 206. The storage element 204 may be included in the physical page 108 of FIG. 1, and the storage element 206 may be included in the physical page 118 of FIG. 1. The storage elements 204, 206 are connected to the structure 202.

The structure 202 may have a variation. For example, as illustrated in the example of FIG. 2, the structure 202 may have a "conical" or "tapered" profile. The location 116 may indicate a region of the structure 202 associated with tapering of the structure 202. For example, in the example of FIG. 2, the structure 202 is not tapered below the location 116 (i.e., nearer to the substrate 208 than the location 116) and the structure 202 is tapered above the location 116 (i.e., farther from the substrate than the location 116). In the example of FIG. 2, the location 116 is between the storage elements 204, 206 because the structure 202 begins "tapering" approximately between the storage elements 204, 206.

By identifying the location 116, accuracy of operations at the data storage device 102 can be improved. For example, by identifying the location 116, the storage elements 204, 206 may be associated with different ECC parameters and/or different memory access parameters to compensate for differences in physical characteristics of the storage elements 204, 206 due to tapering of the structure 202. Differences in physical characteristics of storage elements are described further with reference to FIG. 3.

Referring to FIG. 3, a particular illustrative embodiment of a portion of the column 200 is depicted and generally designated 300. The portion 300 illustrates that a charge trap structure 304 and a conductive channel 306 may be formed within the structure 202. A control gate 302 and a control gate 310 may be connected to the charge trap structure 304. The control gate 302 may be included in the storage element 204 of FIG. 2, and the control gate 310 may be included in the storage element 206 of FIG. 2. The control gates 302, 310 may be separated by a material, such as an oxide region 308.

The control gates 302, 310 and the oxide region 308 may be formed within multiple layers of the memory 104. For example, the control gate 302 may be formed within a layer that includes polysilicon, the oxide region 308 may be formed within a layer that includes oxide, and the control gate 310 may be formed within another layer that includes polysilicon. The control gates 302, 310 and the oxide region 308 may be formed within one or more "physical layers" of the memory 104. For example, a physical layer may include the control gate 302 and the oxide region 308.

It should be appreciated that one or more additional materials may be formed within the structure 202. To illustrate, the charge trap structure 304 may be separated from the control gate 302 and the conductive channel 306 by a gate dielectric, such as a silicon oxide, as an illustrative example. The charge trap structure 304 may include an insulating material, such as silicon nitride, as an illustrative example. The channel may include a conductive material, such as a metal (e.g., copper), as an illustrative example.

The portion 300 may be biased to write a value to the storage element 204 and to sense a value stored at the storage element 204. The portion 300 may be biased to write a value to the storage element 206 and to sense a value stored at the storage element 206. To illustrate, charge may be injected into or drained from the charge trap structure 304 by biasing the control gate 302 relative to the conductive channel 306. In this example, an amount of charge in the charge trap structure 304 affects an amount of current through the conductive channel 306 during a read operation of the storage element 204 and indicates one or more bit values that may be stored in the storage element 204. As another example, charge may be injected into or drained from the charge trap structure 304 by biasing the control gate 310 relative to the conductive channel 306. In this example, an amount of charge in the charge trap structure 304 affects an amount of current through the conductive channel 306 during a read operation of the storage element 206 and indicates a state of the storage element 206. The state of the storage element 206 may correspond to one or more bit values that are stored by the storage element 206.

FIG. 3 illustrates a variation (or "tapering") associated with the structure 202. The variation may correspond to a difference between a first width of the structure at a first distance from the substrate 208 and a second width of the structure at a second distance from the substrate 208, where the second distance is greater than the first distance. To further illustrate, FIG. 3 illustrates that a variation associated with the structure 202 may affect a channel width 312 (e.g., radius) that is associated with the control gate 302. FIG. 3 further indicates that a channel width 314 (e.g., radius) associated with the control gate 310 may be less than the channel width 312 due to tapering of the structure 202. Because the channel width 314 is greater than the channel width 312, operation of the storage element 204 of FIG. 2 may differ from operation of the storage element 206 of FIG. 2. For example, because the width of the conductive channel 306 affects an amount of current conducted by the structure 202, the difference between the channel widths 312, 314 may affect operation of a memory that includes the portion 300. Accordingly, biasing the control gate 302 with a voltage may cause the conductive channel 306 to conduct less current as compared to applying the voltage to the control gate 310. In this case, programming the storage elements 204, 206 using a common programming voltage may cause the storage elements 204, 206 to store different threshold voltages (because a greater programming voltage may be needed to activate the control gate 302 relative to the control gate 310), which may result in an "incorrect" state being programmed to the storage element 204. During a sense operation that senses a state of the storage element 204, a greater voltage (relative to the storage element 206) may be applied to the control gate 302 to cause conduction to occur from the control gate 302 to the conductive channel 306 (or for the storage element 204 to "turn on"). Therefore, a variation of the structure 202 may cause read operations of the storage element 204 to differ relative to the storage element 206. In this case, sensing the storage elements 204, 206 using a common read voltage may result in different states being sensed from the storage elements 204, 206 (because a greater read voltage may be needed to activate the control gate 302 relative to the control gate 310), which may result in an "incorrect" state being sensed from the storage element 204.

Alternatively or in addition, and depending on the particular implementation, a variation of the structure 202 may cause a gate-to-channel distance 316 associated with the storage element 204 to be greater than a gate-to-channel distance 318 associated with the storage element 206. In this case, the charge trap structure 304 may have a greater taper effect than the conductive channel 306. During a write operation that programs a state to the storage element 204, a greater voltage (relative to the storage element 206) may be applied to the control gate 302 to accumulate charge within the charge trap structure 304 (e.g., by drawing electrons from the conductive channel 306 to within the charge trap structure 304). Therefore, tapering of the structure 202 may cause programming operations of the storage element 204 to differ relative to the storage element 206, which may result in an "incorrect" state being programmed to and/or sensed from the storage element 204.

FIG. 3 illustrates that a variation (e.g., tapering) of a structure (e.g., the structure 202) extending through multiple layers of a memory (e.g., the memory 104) may affect read and write operations of the memory. Performance of a memory that includes the portion 300 may be improved by using different ECC techniques and/or memory access techniques for the storage elements 204, 206. For example, because a variation of the structure 202 occurs at the location 116, a first ECC technique and/or a first memory access technique may be associated with the storage element 206, and a second ECC technique and/or a second memory access technique may be associated with the storage element 204 to improve operation of the memory 104. The second ECC technique may compensate for a greater number of errors that may occur at the storage element 204 as compared to the storage element 206 due to "tapering" of the structure 202. For example, the second ECC technique may have a higher error correction capability than the first ECC technique, which may improve error correction. The second memory access technique may compensate for a greater number of write errors and/or read errors that may occur at the storage element 204 as compared to the storage element 206 due to "tapering" of the structure 202. For example, the second memory access technique may program the storage element 204 using a different programming voltage (as compared to the first memory access technique) in order to program the storage element 204 to the "correct" state. As another example, the second memory access technique may sense the storage element 204 using a different read voltage (as compared to the first memory access technique) in order to read the storage element 204 at the "correct" threshold voltage (e.g., to compensate for reduced effectiveness of programming operations at the storage element 204 caused by tapering of the structure 202). As described further with reference to FIG. 4, ECC techniques and/or memory access techniques can be selectively applied to physical pages of a block based on a location of a variation of a structure.

Referring to FIG. 4, a particular illustrative embodiment of a block (e.g., an erase group of storage elements) is depicted and generally designated 400. The block 400 may be included in the memory 104 of FIG. 1. The example of FIG. 4 illustrates that the block 400 may include the physical pages 108, 118 and may further include the column 200.

The block 400 may further include a column 404 and a column 406. The columns may be formed upon the substrate 208. The columns 200, 404, and 406 may include multiple physical pages (e.g., word lines of storage elements) formed within layers of the memory 104. For example, the physical pages 108, 118 may be formed within multiple layers of the block 400. Each physical page of the block 400 may include multiple storage elements. As an example, the storage element 204 of FIG. 2 may be formed within the physical page 108, and the storage element 206 of FIG. 2 may be formed within the physical page 118.

In the example of FIG. 4, a variation (e.g., tapering) occurs in a structure of each of the columns 200, 404, and 406. It should be appreciated that, depending on the particular fabrication process, a block may include one or more columns with structures that do not include (or that do not substantially include) a variation. FIG. 4 further depicts that the variation within each of the columns 200, 404, and 406 occurs at (or approximately at) the location 116. It should be appreciated that variations within the columns 200, 404, and 406 may occur at different locations (e.g., at different heights above the substrate 208).

FIG. 4 illustrates that a location (e.g., the location 116) of a variation of a structure may occur between (or approximately between) physical pages of a block, such as the block 400. The data storage device 102 may apply techniques for encoding, writing, reading, and decoding data from a physical page of the block 400 based on a location of the physical page relative to the location 116. As described further with reference to FIG. 5, the location 116 may define multiple levels of a three-dimensional (3D) memory.

Figures 5, 6:
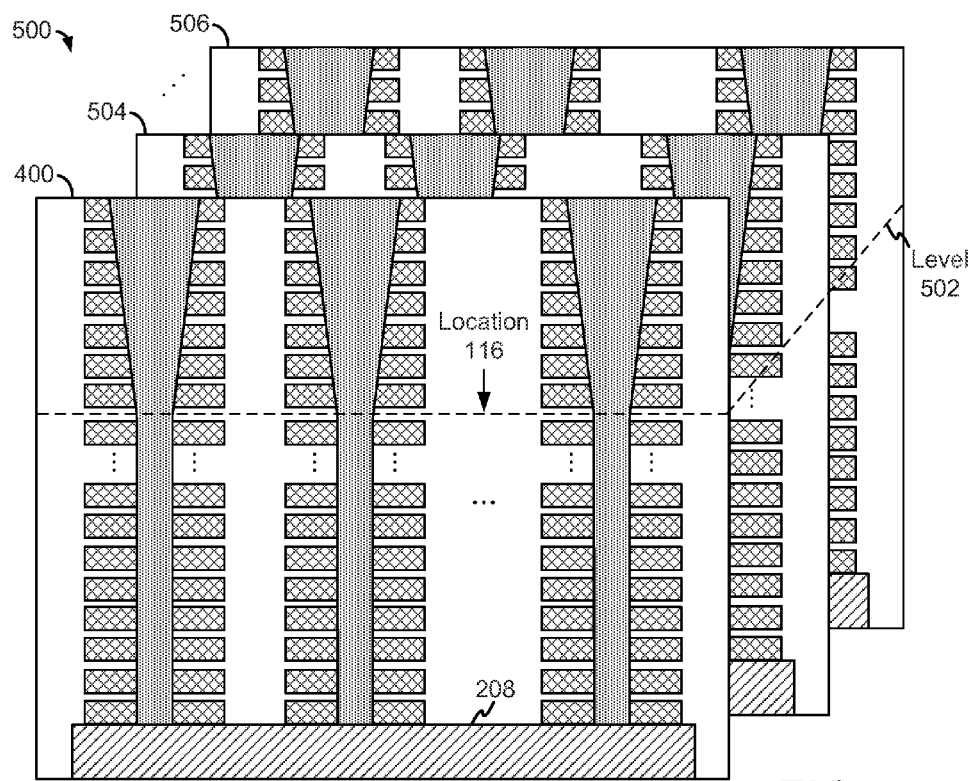

Referring to FIG. 5, a particular illustrative embodiment of a three dimensional (3D) memory is depicted and generally designated 500. The 3D memory 500 may be included in the memory 104 of FIG. 1. The 3D memory 500 may include the block 400 of FIG. 4. The 3D memory 500 may further include a block 504 and a block 506. Each of the blocks 400, 504, and 506 may be formed upon the substrate 208.

In FIG. 5, the location 116 defines a level 502. The level 502 may "partition" the 3D memory 500 into multiple levels (e.g., a "bottom" level that is adjacent to the substrate 208 and a "top" level that is non-adjacent to the substrate 208). For example, the level 502 may define a plane that intersects each of the blocks 400, 504, and 506 at a level k, where k is a positive integer indicating a distance between the substrate 208 and the location 116. The level k may indicate a number of physical pages of the 3D memory 500 between the substrate 208 and the location 116.

In a particular embodiment, the wear distributor 168 of FIG. 1 is configured to perform "intra-level" wear leveling of the 3D memory 500. The wear distributor 168 may confine a first wear leveling process to storage elements within a first set of physical pages located below the level 502 and may further confine a second wear leveling process to storage elements within a second set of physical pages located above the level 502. As an illustrative example, the wear distributor 168 may distribute wear within the first set by moving the ECC codeword 120 among physical pages of the 3D memory 500 below the level 502 and may distribute wear within the second set by moving the ECC codeword 110 among physical pages of the 3D memory 500 above the level 502.

An intra-level wear leveling technique may advantageously enable the controller 130 to maintain a first set of ECC codewords associated with a first encoding technique (e.g., having a first number of ECC bits) within the first set of physical pages and a second set of ECC codewords associated with a second encoding technique (e.g., having a second number of ECC bits) within the second set of physical pages. The intra-level wear leveling process may improve operation of the data storage device 102 by avoiding programming of a "short" ECC codeword (e.g., the ECC codeword 120) to a physical page located above the level 502 (which may result in a bit error rate of data exceeding an error correction capability of the ECC engine 132) and/or by avoiding programming of an "extended" ECC codeword (e.g., the ECC codeword 110) to a physical page located below the level 502 (for which a "short" ECC codeword may suffice).

The level 502 may intersect each of the blocks 400, 504, and 506 at a common level k. Alternatively, depending on the particular fabrication process used to fabricate the 3D memory 500, the level 502 may intersect two or more of the blocks 400, 504, and 506 at different locations. To illustrate, the level 502 may intersect the block 400 at a first distance from the substrate 208, the level 502 may intersect the block 504 at a second distance from the substrate 208, and the level 502 may intersect the block 506 at a third distance from the substrate 208. In this example, the level 502 may correspond to a "non-uniform" plane, such as an inclined plane. An illustrative example of an inclined plane is described further with reference to FIG. 6.

Referring to FIG. 6, a particular illustrative example of a table is depicted and generally designated 600. In a particular embodiment, the table 600 is included in the information 146 of FIG. 1. The table 600 may represent characteristics of a memory having a three-dimensional (3D) memory configuration. The memory may correspond to the memory 104 and/or the 3D memory 500.

FIG. 6 illustrates that the table 600 may include a block column and a location column. The block column may include block entries 602, 606, and 610. The location column may include location entries 604, 608, and 612. In a particular embodiment, the table 600 indicates an inclined plane that is defined by the level 502 of FIG. 5. For example, the block entry 602 and the location entry 604 indicate that the level 502 intersects a 0th block of the 3D memory 500 at a kth physical page of the 0th block. The block entry 606 and the location entry 608 indicate that the level 502 intersects a 5th block of the 3D memory 500 at a (k+1)th physical page of the 5th block. Further, the block entry 610 and the location entry 612 indicate that the level 502 intersects an Nth block of the 3D memory 500 at a (k+2)th physical page of the Nth block, where N indicates a positive integer number of blocks of the 3D memory 500 (e.g., 512 blocks, or another number of blocks). In this example, the level 502 may correspond to an inclined plane that intersects two or more blocks at different locations (e.g., at physical pages corresponding to k, k+1, and k+2).

The controller 130 may maintain the table 600 to track locations of variations of structures of the 3D memory 500. The locations of variations of structures may be inhomogeneous (e.g., may not define a plane that is parallel to a surface of the substrate 208). To illustrate, the example of FIG. 6 indicates that the level 502 may have an "inclined" shape. Enabling the controller 130 to define an inhomogeneous level (e.g., an inclined plane as indicated by the table 600) may improve performance of the data storage device 102 by enabling the controller 130 to selectively encode, write, read, and/or decode data for a particular block of the memory 104 based on the level 502. It should be appreciated that the example of FIG. 6 is illustrative and that the level 502 may have another shape, such as a uniform shape that intersects each block of the 3D memory 500 at a common distance from the substrate 208, a declined shape, a "lumped" or "jagged" shape, or another shape.

Figure 7:
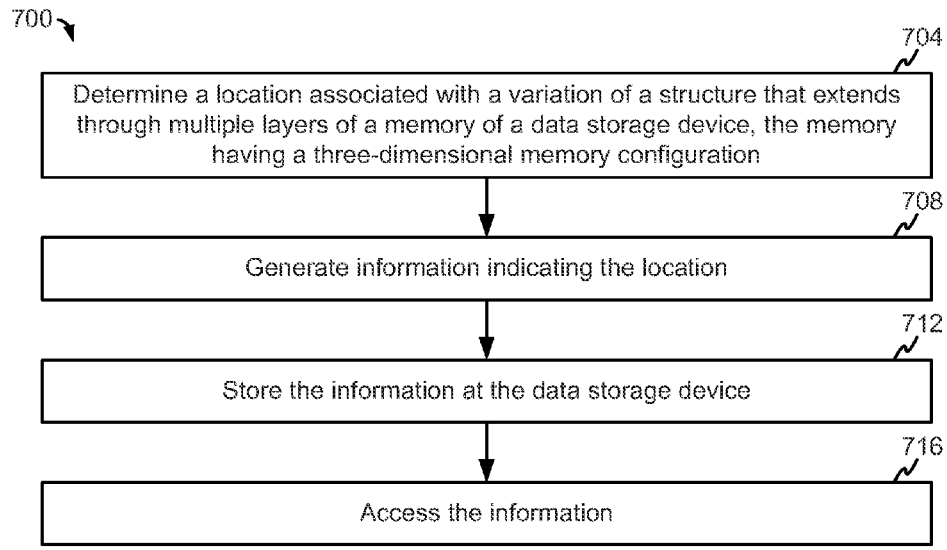
FIGS. 7-15 are flow diagrams that illustrate particular illustrative embodiments of methods of operation of the data storage device of FIG. 1.

Referring to FIG. 7, a particular illustrative embodiment of a method is depicted and generally designated 700. The method 700 may be performed by the data storage device 102 of FIG. 1, such as by the controller 130.

The method 700 includes determining a location associated with a variation of a structure that extends through multiple layers of a memory of a data storage device, at 704. The memory has a three dimensional (3D) memory configuration.

The location may correspond to the location 116, and the structure may correspond to the structure 202. The multiple layers may include the layers 210, 212, and 214, the memory may correspond to the memory 104, and the data storage device may correspond to the data storage device 102.

The method 700 may further include generating information indicating the location, at 708. For example, the information may correspond to the information 146. In a particular embodiment, the information 146 corresponds to the table 600. Alternatively, the information 146 may indicate another table, other information, or a combination thereof.

The method 700 further includes storing the information at the data storage device, at 712. In a particular embodiment, the controller 130 stores the information 146 at the memory 104. In one or more other implementations, the information 146 may be stored at the controller 130, such as at a non-volatile memory portion that may be included in the controller 130 in certain implementations (not shown in FIG. 1). The controller 130 may store (e.g., cache) the information 146 at the RAM 144, as illustrated in FIG. 1.

The method 700 further includes accessing the information, at 716. For example, the controller 130 may access the information to generate the ECC parameter table 148, the memory access parameter table 154, or a combination thereof.

The method 700 may improve performance of the data storage device 102 by enabling the controller 130 to track at least one location of a variation of a structure extending through layers of the memory 104. For example, the method 700 may enable the data storage device 102 to perform a "recalibration" procedure to re-determine at least one location of a variation of a structure that extends through layers of the memory 104. Certain example aspects of a recalibration procedure are described further with reference to FIGS. 8 and 9.

Figure 8:
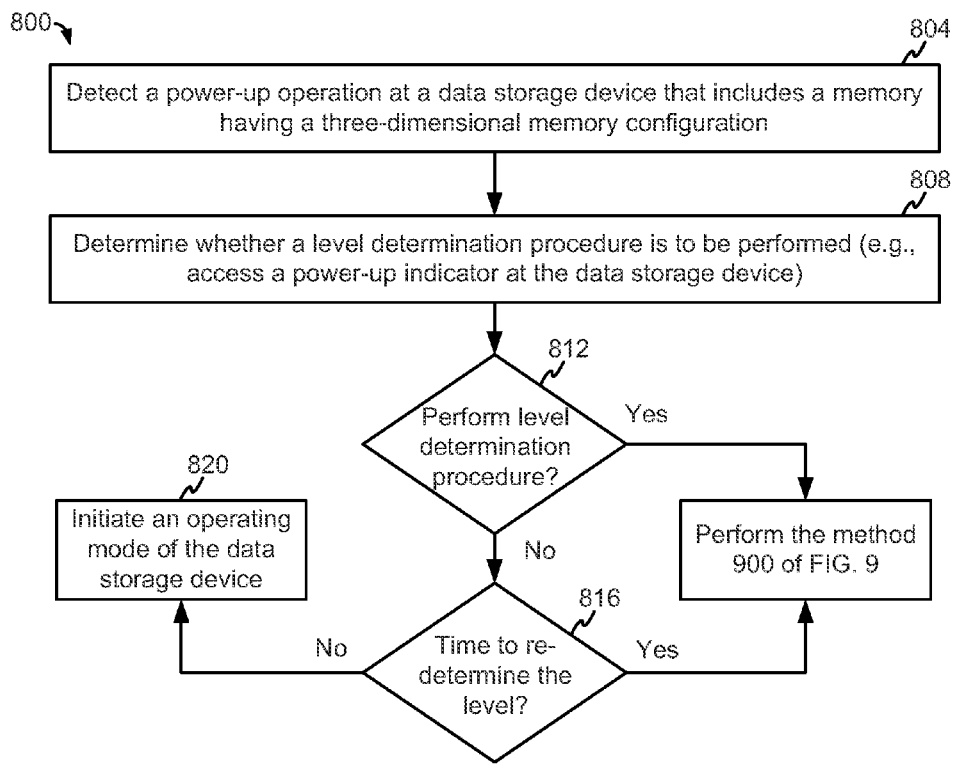

Referring to FIG. 8, a particular illustrative embodiment of a method is depicted and generally designated 800. The method 800 may be performed by the data storage device 102, such as by the controller 130. In an illustrative embodiment, one or more operations of the method 800 are performed by the location identifier 134 of FIG. 1.

The method 800 may include detecting a power-up operation at a data storage device that includes a memory having a three dimensional (3D) memory configuration, at 804. The data storage device may correspond to the data storage device 102, and the memory may correspond to the memory 104. In a particular embodiment, the data storage device 102 includes a power-up detector configured to detect that power is being received at the data storage device 102 (e.g., from the host device 172).

The method 800 may further include determining whether a level determination procedure is to be performed, at 808. For example, the controller 130 may access the power-up indicator 136 to determine whether to perform the level determination procedure. A first value of the power-up indicator 136 may indicate that the level determination procedure has been previously performed (e.g., in response to an initial power-up of the data storage device 102), and a second value of the power-up indicator 136 may indicate that the level determination procedure has not been previously performed (e.g., that the current power-up is an initial power-up of the data storage device 102).

If a determination is made, at 812, that the level determination procedure is not to be performed, the method 800 may further include determining, at 816, whether to perform a level re-determination procedure (or "recalibration" procedure). For example, the controller 130 may periodically or occasionally perform the level re-determination procedure to determine whether the location 116 has shifted (e.g., due to physical wear of the memory 104). In a particular embodiment, the controller 130 is configured to track a number of power-ups of the data storage device 102, and the level re-determination procedure is initiated in response to a threshold number of power-ups of the data storage device 102. As an illustrative example, the controller 130 may initiate the level re-determination procedure in response to a first number (such as an intermediate number) of power-ups of the data storage device 102, which may occur during a middle-of-life (MOL) stage of operation of the data storage device 102. As another illustrative example, the controller 130 may initiate the level re-determination procedure in response to a second number of power-ups of the data storage device 102, such at an end-of-life (EOL) stage of operation of the data storage device 102.

If a determination is made, at 816, not to perform the level re-determination procedure, the method 800 may further include initiating an operating mode of the data storage device, at 820. If a determination is made, at 812, to perform the level determination procedure, or if a determination is made, at 816, to perform the level re-determination procedure, then operation may continue as described with reference to FIG. 9.

Figure 9:
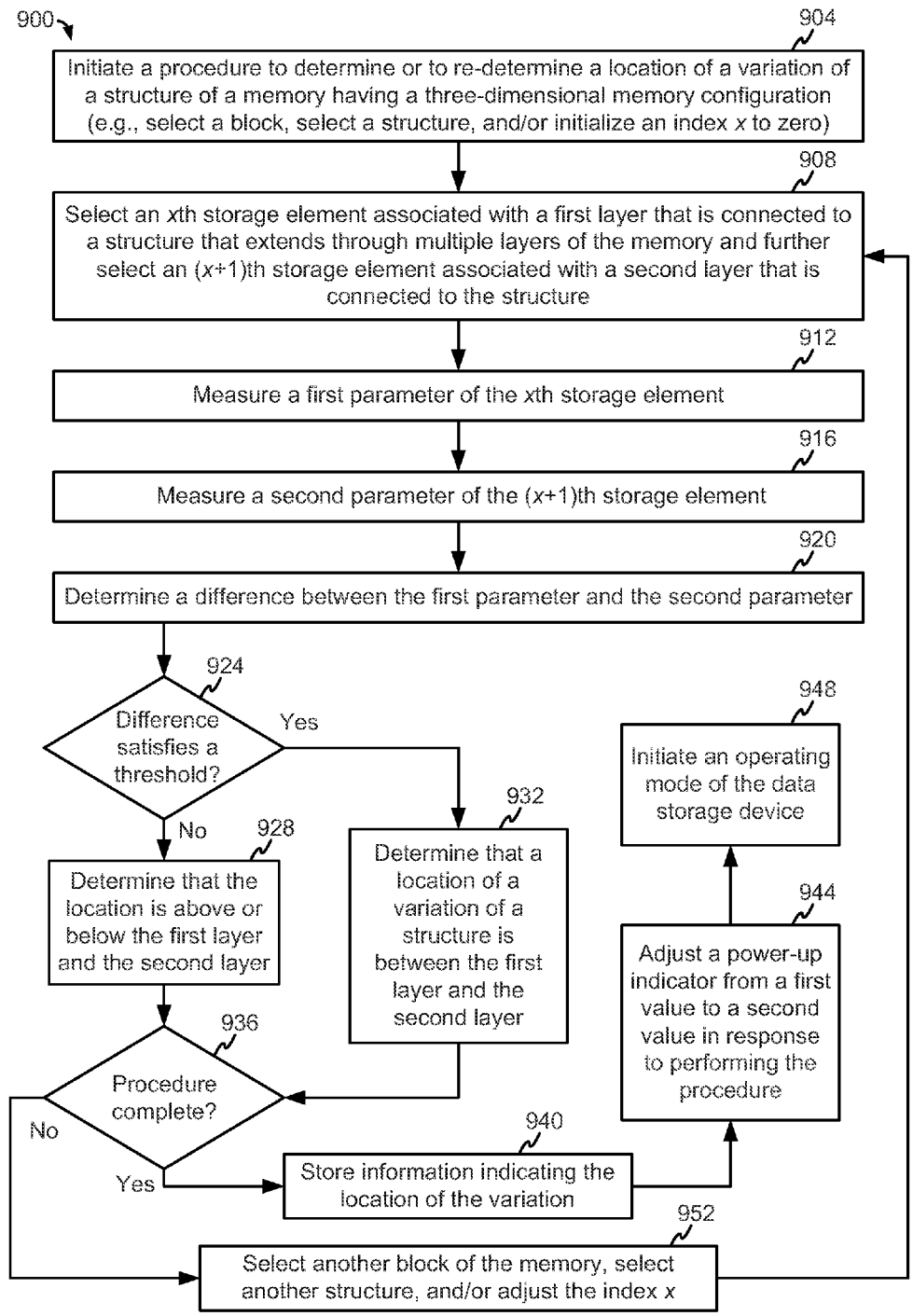

Referring to FIG. 9, a particular illustrative embodiment of a method of determining a location of a variation of a structure is depicted and generally designated 900. The method 900 may be performed by the data storage device 102, such as by the controller 130. In an illustrative embodiment, one or more operations of the method 900 are performed by the location identifier 134 of FIG. 1.

The method 900 may include initiating a procedure to determine or to re-determine a location of a variation of a structure of a memory having a three-dimensional memory configuration, at 904. The memory may correspond to the memory 104, the location may correspond to the location 116, and the structure may correspond to the structure 202. In a particular embodiment, initiating the procedure includes selecting a block of the memory (e.g., one of the blocks 400, 504, and 506), selecting a structure of the block (e.g., a structure of a column, such as the structure 202 of the column 200), and/or initializing a value of an index x to zero, where the index x has an integer value indicating a physical page of the memory.

To illustrate, if a physical page of the memory adjacent to the substrate 208 (or a "bottom" physical page) is indicated by an index value of zero, then the value of the index x may be initialized to zero. In this example, the method 900 may correspond to a "bottom-up" search for a taper effect of a structure, such as the structure 202. In one or more other implementations, a physical page of the memory farthest from the substrate 208 (or a "top" physical page) may be indicated by the index value of zero, and the method 900 may correspond to a "top-down" search for a taper effect of the structure. Alternatively or in addition, the value of the index x may be selected using one or more other techniques (e.g., by randomly or pseudo-randomly selecting the value of the index x).

The method 900 may further include selecting an xth storage element associated with a first layer that is connected to a structure that extends through multiple layers of the memory and further selecting an (x+1)th storage element associated with a second layer that is connected to the structure, at 908. To illustrate, for x=0, the xth storage element may correspond to a storage element of the layer 210, and the (x+1)th storage element may correspond to a storage element of the layer 212.

In this example, the first layer may correspond to the layer 210, and the second layer may correspond to the layer 212.

The method 900 may further include measuring a first parameter of the xth storage element, at 912, and measuring a second parameter of the (x+1)th storage element, at 916. As an example, the measurements 142 of FIG. 1 may indicate the first parameter and the second parameter. The first parameter may correspond to a first number of programming pulses applied to the first storage element to program the first storage element to a particular threshold voltage, and the second parameter may correspond to a second number of programming pulses applied to the second storage element to program the second storage element to the particular threshold voltage, as an illustrative example.

The method 900 may further include determining a difference between the first parameter and the second parameter, at 920. For example, the location identifier 134 may subtract the first parameter from the second parameter to determine the difference.

If a determination is made, at 924, that the difference satisfies a threshold, the method 900 may further include determining that a location of a variation of a structure is between the first layer and the second layer, at 932. For example, the location may correspond to the location 116, and the structure may correspond to the structure 202. The variation may correspond to a "tapering" of the structure 202 that occurs between (or approximately between) the first layer and the second layer.

The threshold may be selected based on particular device parameters. For example, expected values of the channel widths 312, 314 and/or expected values of the gate-to-channel distances 316, 318 may be determined based on a fabrication process used to fabricate the memory 104. Expected values of channel widths and/or expected values of gate-to-channel distances may be used to determine expected operating characteristics of storage elements of the memory 104. The threshold of FIG. 9 may be selected based on the expected operating characteristics. For example, a "tolerance" range may be defined for operating characteristics of storage elements of the memory 104. The threshold of FIG. 9 may correspond to such a tolerance range, and an indication of the threshold may be stored at the data storage device 102 (e.g., at the memory 104) to be accessed by the controller 130.

If a determination is made, at 924, that the difference fails to satisfy the threshold, the method 900 may further include determining that the location of the variation (if any) is above or below the first layer and the second layer, at 928. For example, in a "bottom-up" search, the location identifier 134 may determine that the location of the variation (if any) is above the first layer and the second layer. In a "top-down" search, the location identifier 134 may determine that the location of the variation (if any) is below the first layer and the second layer.

The method 900 may further include determining whether the procedure is complete, at 936. For example, the procedure may be performed to determine (or attempt to determine) at least one location of a variation in each block of the memory. If the procedure is complete (e.g., has been performed for each block of the memory), the method 900 may further include storing information indicating the location of the variation, at 940. The information may correspond to the information 146 and/or may represent the table 600.

The method 900 may further include adjusting a power-up indicator from a first value to a second value in response to performing the procedure, at 944. The power-up indicator may correspond to the power-up indicator 136. In a particular embodiment, the power-up indicator 136 is changed from the first value to the second value in response to performing a first iteration of the procedure and in response to an initial power-up of the data storage device 102. After the initial power-up of the data storage device 102, the method 900 may be re-performed, such as at a middle-of-life (MOL) operating stage of the data storage device 102 (e.g., after a first number of power-ups of the data storage device 102) and/or at an end-of-life (EOL) operating stage of the data storage device 102 (e.g., after a second number of power-ups of the data storage device 102). In a particular embodiment, the controller 130 is configured to maintain an indication of a number of power-ups of the data storage device 102, such as at a state machine that may be included in the controller 130.

The method 948 may further include initiating an operating mode of the data storage device, at 948. For example, the data storage device 102 may enter a mode of operation in which data is stored to and accessed from the memory 104.

If a determination is made, at 936, that the procedure is not complete, the method 900 may include selecting another block of the memory, selecting another structure of a block of the memory, and/or adjusting the value of the index x, at 952. For example, after measuring parameters for a first storage element associated with a first layer of the memory 104 and a second storage element associated with a second layer of the memory 104, a third parameter may be measured for a third storage element associated with a third layer of the memory 104 that is connected to a structure that extends through multiple layers of the memory. The third parameter may be compared to the second parameter to determine a difference (e.g., to detect a variation between the third layer and the second layer). In this example, the method 900 may continue, at 908, after incrementing the value of the index x.

Alternatively or in addition, the location identifier 134 may determine locations of multiple variations for a single block of the memory 104. To illustrate, if the location 116 is determined for the column 200 of the block 400 of FIG. 4, the location identifier 134 may determine a location of a variation of another structure of the memory 104, such as a structure of the column 404 and/or a variation of a structure of the column 406. The location identifier 134 may determine an average location of variations of the block 400, such as when tapering effects associated with the columns 200, 404, and 406 are non-uniform (e.g., have different profiles). Accordingly, the location 116 may correspond to an average location of variations of the columns 200, 404, and 406. In this case, if a location of a variation has been determined for one column of the block (e.g., the column 200), another column of the block may be selected (e.g., by selecting the column 404 or the column 406), and the method 900 may continue, at 908.

Alternatively or in addition, the location identifier 134 may determine locations of variations for multiple blocks of the memory 104. In this example, if a location of a variation has been determined for a particular block (e.g., the block 400), another block (e.g., the block 504 or the block 506) may be selected, and the method 900 may continue, at 908.

The method 900 enables determination of locations of one or more variations of structures that extend through layers of a memory having a 3D memory configuration. For example, the method 900 may enable the controller 130 to identify a "taper" effect that occurs at the location 116 of the structure 202 of FIG. 2. In a particular embodiment, the controller 130 uses the location 116 to determine one or more ECC techniques and/or one or more memory access techniques, as described further with reference to FIGS. 10-15.

Figure 10:
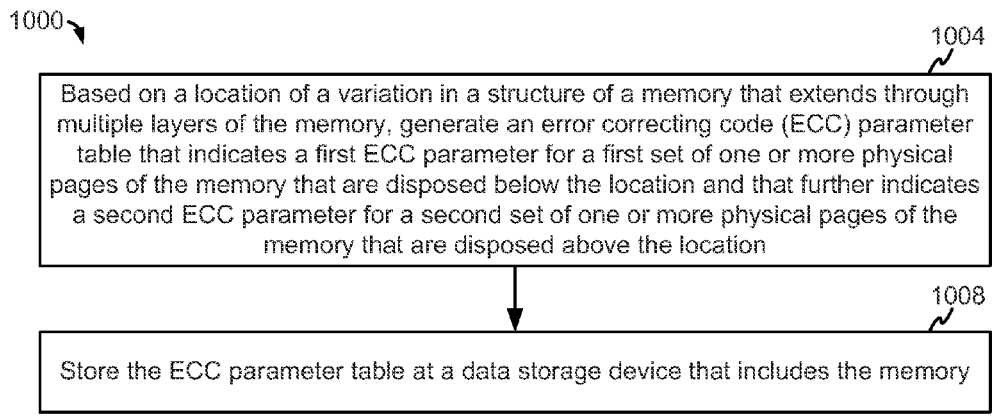

Referring to FIG. 10, a particular illustrative embodiment of a method is depicted and generally designated 1000. The method 1000 may be performed by the data storage device 102, such as by the controller 130. In an illustrative embodiment, one or more operations of the method 1000 are performed by the location identifier 134 of FIG. 1.

The method 1000 may include generating an error correcting code (ECC) parameter table that indicates a first ECC parameter for a first set of one or more physical pages of a memory that are disposed below a location and that further indicates a second ECC parameter for a second set of one or more physical pages of the memory that are disposed above the location, at 1004. The ECC parameter table is generated based on a location of a variation in a structure of the memory that extends through multiple layers of the memory. The memory may correspond to the memory 104, the location may correspond to the location 116, and the structure may correspond to the structure 202. The first set may include the physical page 118, and the second set may include the physical page 108. The ECC parameter table may correspond to the ECC parameter table 148, the first parameter may correspond to the parameter 150, and the second parameter may correspond to the parameter 152. The parameters 150, 152 may indicate encoding techniques and/or decoding techniques that are usable by the ECC engine 132, as illustrative examples.

The method 1000 may further include storing the ECC parameter table at a data storage device that includes the memory, at 1008. The data storage device may correspond to the data storage device 102. The ECC parameter table may be stored (e.g., cached) at the RAM 144, as illustrated in FIG. 1. Alternatively or in addition, the ECC parameter table may be stored at the memory 104.

The method 1000 illustrates that an ECC parameter table may be generated based on a location of a variation of a structure of a memory, such as the memory 104. The ECC parameter table may be used to adjust encoding techniques and/or decoding techniques based on a physical location of the data (e.g., based on whether data is to be written to or read from the physical page 108 versus the physical page 118).

Figure 11:
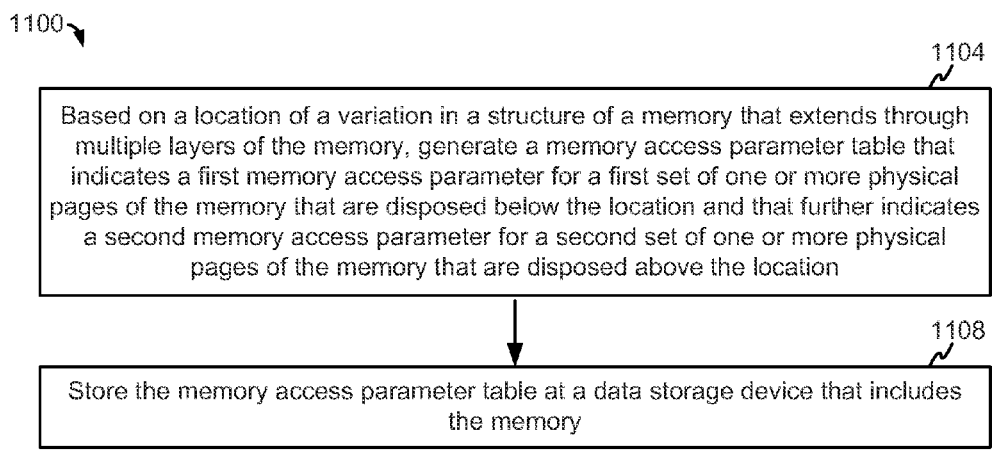

Referring to FIG. 11, a particular illustrative embodiment of a method is depicted and generally designated 1100. The method 1100 may be performed by the data storage device 102, such as by the controller 130. In an illustrative embodiment, one or more operations of the method 1100 are performed by the location identifier 134 of FIG. 1.

The method 1100 may include generating a memory access parameter table that indicates a first memory access parameter for a first set of one or more physical pages of a memory that are disposed below a location and that further indicates a second memory access parameter for a second set of one or more physical pages of the memory that are disposed above the location, at 1104. The memory access parameter table is generated based on a location of a variation in a structure of the memory that extends through multiple layers of the memory. The memory may correspond to the memory 104, the location may correspond to the location 116, and the structure may correspond to the structure 202. The first set may include the physical page 118, and the second set may include the physical page 118. The memory access parameter table may correspond to the memory access parameter table 154, the first parameter may correspond to the parameter 156, and the second parameter may correspond to the parameter 158. The parameters 156, 158 may indicate read techniques and/or write techniques that are usable by the read/write circuitry 106, as illustrative examples.

The method 1100 may further include storing the memory access parameter table at a data storage device that includes the memory, at 1108. The data storage device may correspond to the data storage device 102. The memory access parameter table may be stored (e.g., cached) at the RAM 144, as illustrated in FIG. 1. Alternatively or in addition, the memory access parameter table may be stored at the memory 104.

The method 1100 illustrates that a memory access parameter table may be generated based on a location of a variation of a structure of a memory, such as the memory 104. The memory access parameter table may be used to adjust write techniques and/or read techniques based on a physical location of the data (e.g., based on whether data is to be written to or read from the physical page 108 versus the physical page 118).

Figure 12:
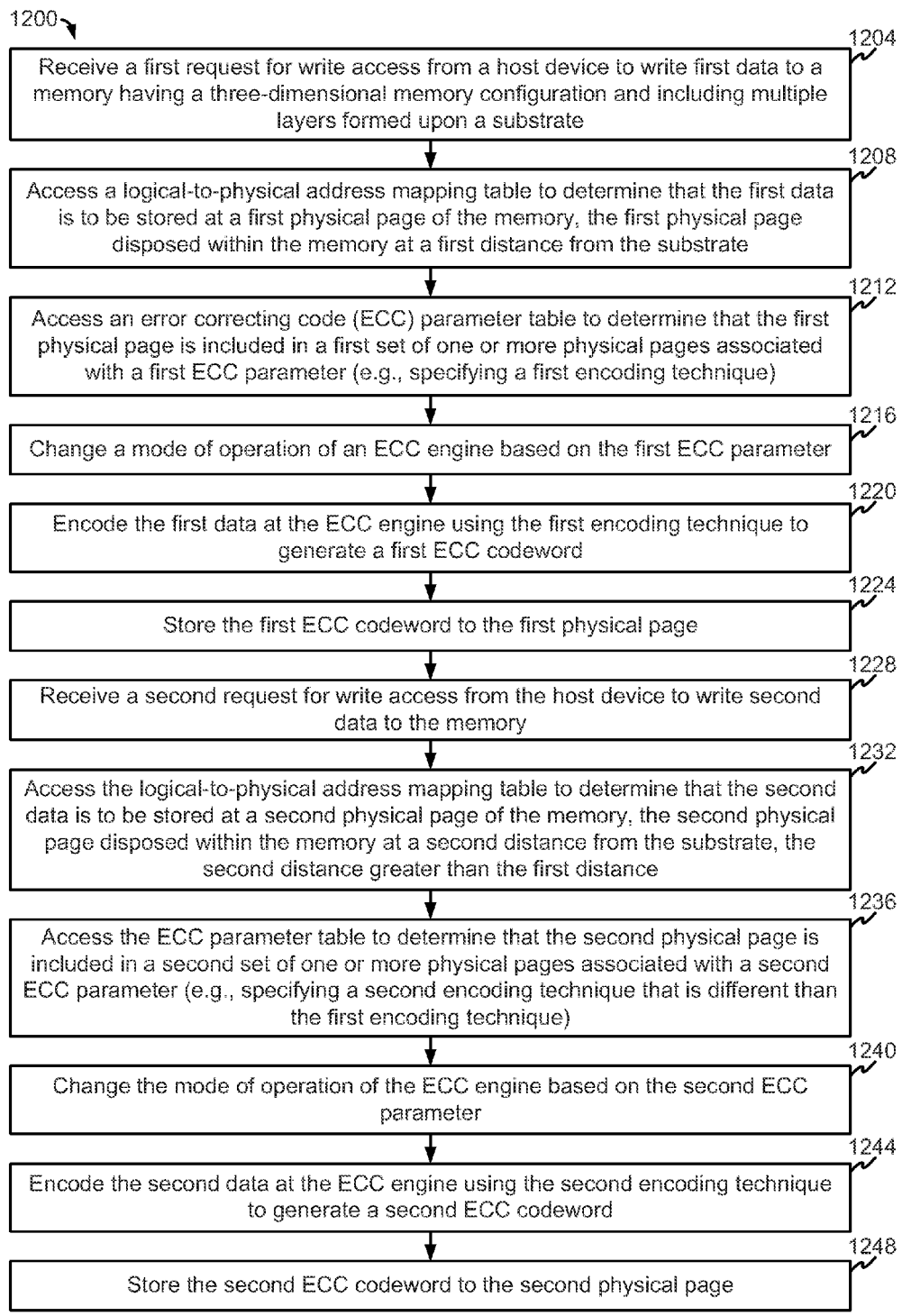

Referring to FIG. 12, a particular illustrative embodiment of a method is depicted and generally designated 1200. The method 1200 may be performed by the data storage device 102. For example, certain operations of the method 1200 may be performed by the controller 130, the read/write circuitry 106, or a combination thereof.

The method 1200 may include receiving a first request for write access from a host device to write first data to a memory having a three-dimensional memory configuration and including multiple layers formed upon a substrate, at 1204. The memory may correspond to the memory 104, and the host device may correspond to the host device 172. The first data may correspond to the data 122, and the substrate may correspond to the substrate 208. The multiple layers may include the layers 210, 212, and 214.

The method 1200 may further include accessing a logical-to-physical address mapping table to determine that the first data is to be stored at a first physical page of the memory, at 1208. The first physical page is disposed within the memory at a first distance from the substrate. The logical-to-physical address mapping table may correspond to the logical-to-physical address mapping table 166, and the first physical page may correspond to the physical page 118.

The method 1200 may further include accessing an error correcting code (ECC) parameter table to determine that the first physical page is included in a first set of one or more physical pages associated with a first ECC parameter, at 1212. The ECC parameter table may correspond to the ECC parameter table 148, and the first parameter may correspond to the parameter 150. In an illustrative embodiment, the parameter 150 indicates a first encoding technique.

The method 1200 may further include changing a mode of operation of an ECC engine based on the first ECC parameter, at 1216. The ECC engine may correspond to the ECC engine 132. The mode of operation of the ECC engine 132 may be changed by the controller 130 by causing the ECC engine 132 to encode data using the first encoding technique, such as by activating a first encoder of the ECC engine 132 and/or by deactivating a second encoder of the ECC engine 132.

The method 1200 may further include encoding the first data at the ECC engine using the first encoding technique to generate a first ECC codeword, at 1220. The first ECC codeword may correspond to the ECC codeword 120.

The method 1200 may further include storing the first ECC codeword to the physical page, at 1224. For example, the controller 130 may instruct the read/write circuitry 106 to store the ECC codeword 120 at the physical page 118.

The method 1200 may further include receiving a second request for write access from the host device to write second data to the memory, at 1228. The second data may correspond to the data 112.

The method 1200 may further include accessing the logical-to-physical address mapping table to determine that the second data is to be stored at a second physical page of the memory, at 1232. The second physical page is disposed within the memory at a second distance from the substrate, and the second distance is greater than the first distance. The second physical page may correspond to the physical page 108.

The method 1200 may further include accessing the ECC parameter table to determine that the second physical page is included in a second set of one or more physical pages associated with a second ECC parameter, at 1236. The second ECC parameter may specify a second encoding technique that is different than the first encoding technique. The second ECC parameter may correspond to the parameter 152.

The method 1200 may further include changing the mode of operation of the ECC engine based on the second ECC parameter, at 1240. To illustrate, the controller 130 may deactivate a first encoder of the ECC engine 132 associated with the first encoding technique and may activate a second encoder of the ECC engine 132 associated with the second encoding technique.

The method 1200 may further include encoding the second data at the ECC engine using the second encoding technique to generate a second ECC codeword, 1244. The second ECC codeword may correspond to the ECC codeword 110.

The method 1200 may further include storing the second ECC codeword to the second physical page, at 1248. To illustrate, the controller 130 may instruct the read/write circuitry 106 to store the ECC codeword 110 at the physical page 108.

The method 1200 may improve accuracy of encoding operations at the data storage device 102. For example, because a variation of the structure 202 may increase a bit error rate of data stored at the physical page 108 relative to data stored at the physical page 118, data to be stored at the physical pages 108, 118 may be encoded using different techniques.

Figure 13:
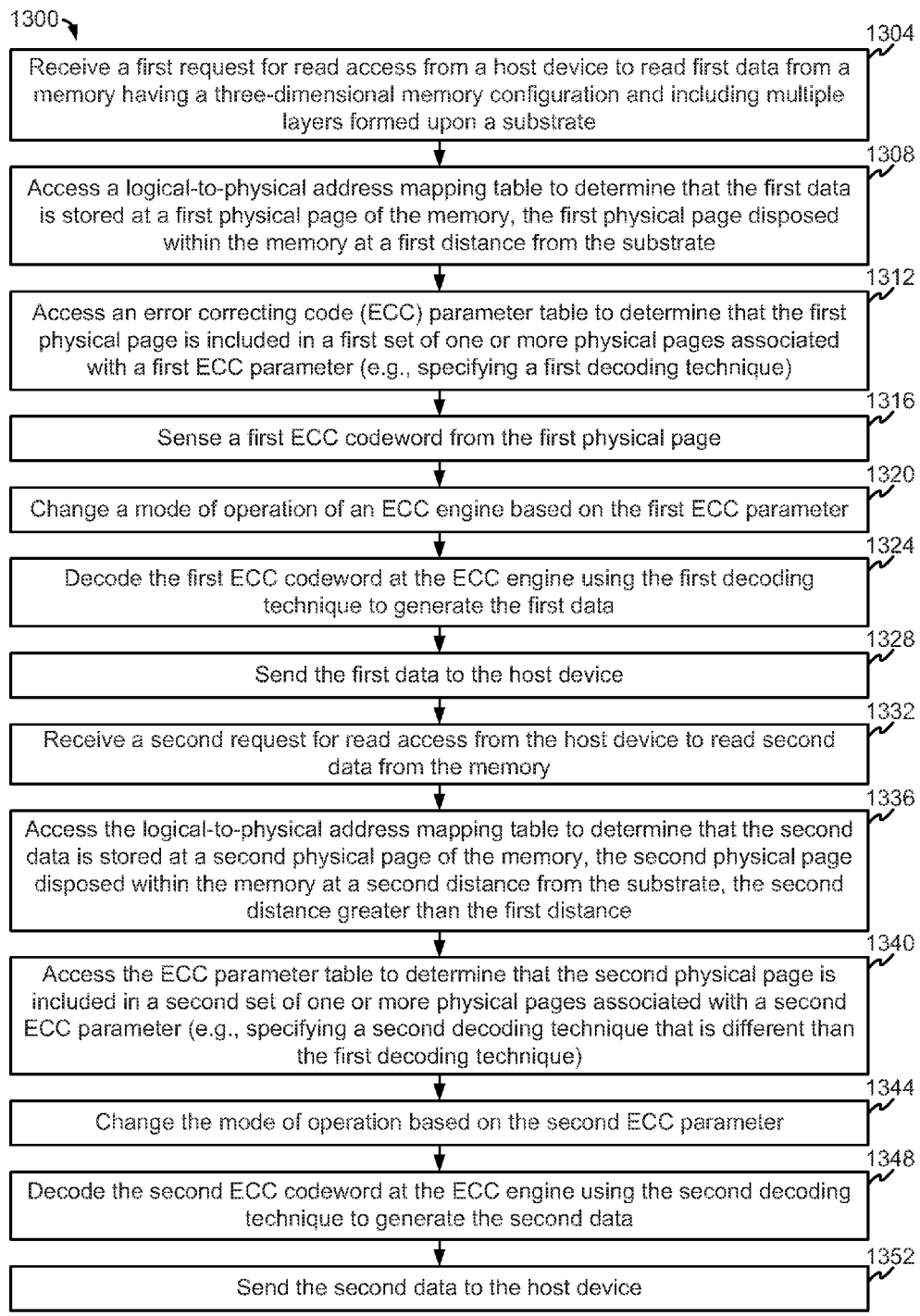

Referring to FIG. 13, a particular illustrative embodiment of a method is depicted and generally designated 1300. The method 1300 may be performed by the data storage device 102. For example, certain operations of the method 1300 may be performed by the controller 130, the read/write circuitry 106, or a combination thereof.

The method 1300 may include receiving a first request for read access from a host device to read first data from a memory having a three-dimensional memory configuration and including multiple layers formed upon a substrate, at 1304. The memory may correspond to the memory 104, and the host device may correspond to the host device 172. The substrate may correspond to the substrate 208, and the multiple layers may include the layers 210, 212, and 214. The first data may correspond to the data 122.

The method 1300 may further include accessing a logical-to-physical address mapping table to determine that the first data is stored at a first physical page of the memory, at 1308. The first physical page is disposed within the memory at a first distance from the substrate. The logical-to-physical address mapping table may correspond to the logical-to-physical address mapping table 166, and the first physical page may correspond to the physical page 118.

The method 1300 may further include accessing an error correcting code (ECC) parameter table to determine that the first physical page is included in a first set of one or more physical pages associated with a first ECC parameter, at 1312. The ECC parameter table may correspond to the ECC parameter table 148, and the first ECC parameter may correspond to the parameter 150. In a particular embodiment, the parameter 150 specifies a first decoding technique.

The method 1300 may further include sensing a first ECC codeword from the first physical page, at 1316. The first ECC codeword may correspond to the ECC codeword 120.

The method 1300 may further include changing a mode of operation of an ECC engine based on the first ECC parameter, at 1320. The ECC engine may correspond to the ECC engine 132. In a particular embodiment, the ECC engine 132 includes a first decoder configured to decode ECC codewords using the first ECC decoding technique, and the controller 130 changes the mode of operation of the ECC engine 132 by enabling the first decoder.

The method 1300 may further include decoding the first ECC codeword at the ECC engine using the first decoding technique to generate the first data, at 1324. For example, the controller 130 may input the ECC codeword 120 to the first decoder, and the first decoder may output the data 122.

The method 1300 may further include sending the first data to the host device, at 1328. For example, the controller 130 may send the data 122 to the host device 172 via the host interface 170.

The method 1300 may further include receiving a second request for read access from the host device to read second data from the memory, at 1332. The second data may correspond to the data 112.

The method 1300 may further include accessing the logical-to-physical address mapping table to determine that the second data is stored at a physical page of the memory, at 1336. The second physical page is disposed within the memory at a second distance from the substrate, and the second distance is greater than the first distance. The second physical page may correspond to the physical page 108.

The method 1300 may further include accessing the ECC parameter table to determine that the second physical page is included in a second set of one or more physical pages associated with a second ECC parameter, at 1340. The second ECC parameter may specify a second decoding technique that is different than the first decoding technique. In a particular embodiment, the second parameter corresponds to the parameter 152.

The method 1300 may further include changing the mode of operation of the ECC engine based on the second ECC parameter, at 1344. For example, in a particular embodiment, the controller 130 deactivates the first decoder of the ECC engine 132 and activates a second decoder of the ECC engine 132.

The method 1300 may further include decoding the second ECC codeword at the ECC engine using the second decoding technique to generate the second data, at 1348. For example, the controller 130 may input the ECC codeword 110 at the second decoder of the ECC engine 132, and the second decoder may output the data 112.

The method 1300 may further include sending the second data to the host device, at 1352. To illustrate, the controller 130 may send the data 112 to the host device 172 via the host interface 170.

The method 1300 may improve accuracy of decoding operations at the data storage device 102. For example, because a variation of the structure 202 may increase a bit error rate of data stored at the physical page 108 relative to data stored at the physical page 118, data read from the physical pages 108, 118 may be decoded using different techniques.

Figure 14:
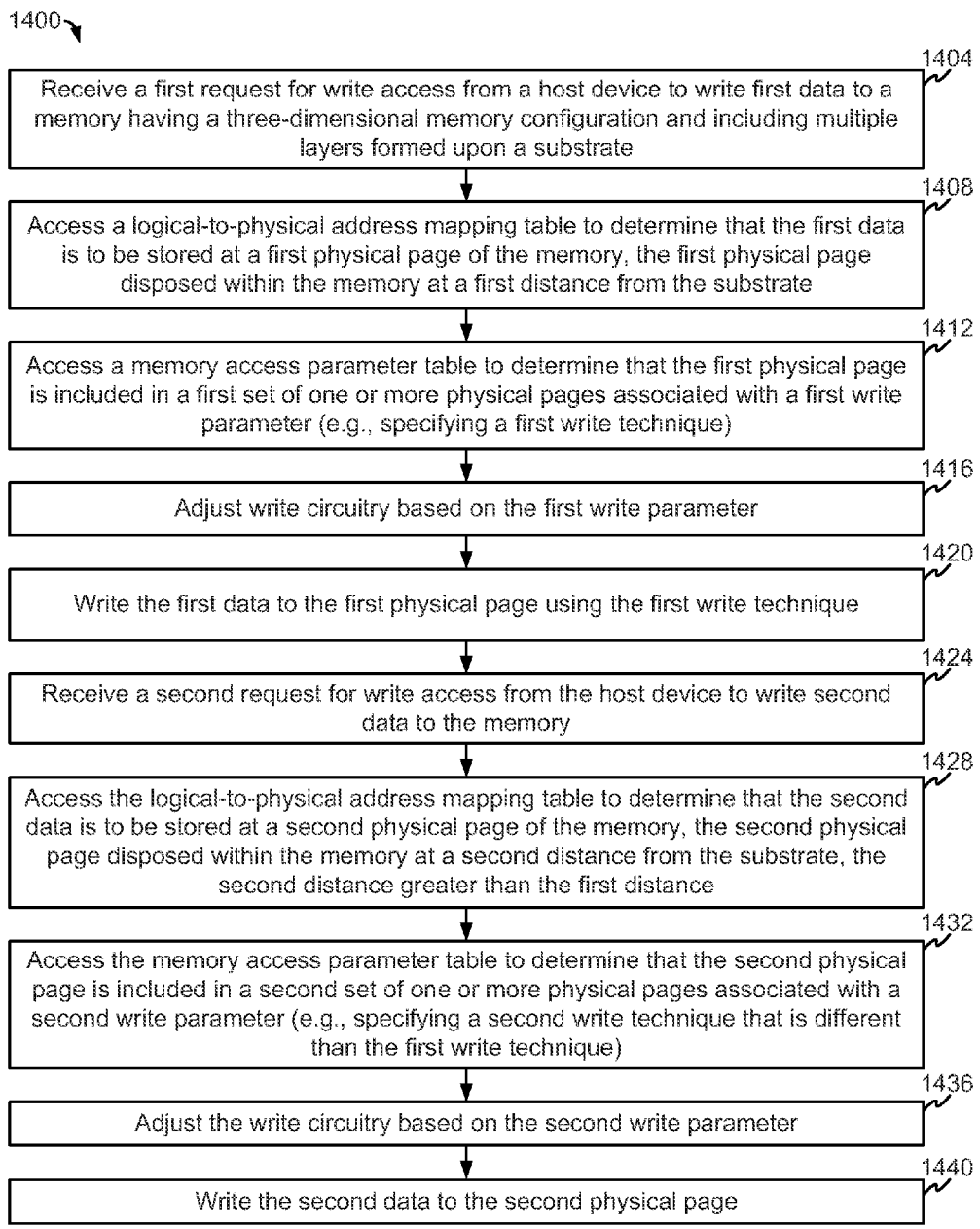

Referring to FIG. 14, a particular illustrative embodiment of a method is depicted and generally designated 1400. The method 1400 may be performed by the data storage device 102. For example, certain operations of the method 1400 may be performed by the controller 130, the read/write circuitry 106, or a combination thereof.

The method 1400 may include receiving a first request for write access from a host device to write first data to a memory having a three-dimensional memory configuration and including multiple layers formed upon a substrate, at 1404. The memory may correspond to the memory 104, and the host device may correspond to the host device 172. The substrate may correspond to the substrate 208, and the multiple layers may include the layers 210, 212, and 214. The first request may correspond to the first request described with reference to FIG. 12, or to another request.

The method 1400 may further include accessing a logical-to-physical address mapping table to determine that the first data is to be stored at a first physical page of the memory, at 1408. The first physical page is disposed within the memory at a first distance from the substrate. The first physical page may correspond to the physical page 118.

The method 1400 may further include accessing a memory access parameter table to determine that the first physical page is included in a first set of one or more physical pages associated with a first write parameter, at 1412. The memory access parameter table may correspond to the memory access parameter table 154, and the first write parameter may correspond to the parameter 156. In a particular embodiment, the parameter 156 indicates a programming voltage to be applied to the physical page 118.

The method 1400 may further include adjusting write circuitry based on the first write parameter, at 1416. To illustrate, the controller 130 may send one or more control signals to the read/write circuitry 106 to cause the read/write circuitry 106 to write data using a first programming voltage indicated by the parameter 156.

The method 1400 may further include writing the first data to the first physical page using the first write technique, at 1420. For example, the data 122 may be written to the physical page 118 within the ECC codeword 120.

The method 1400 may further include receiving a second request for write access from the host device to write second data to the memory, at 1424. The second data may correspond to the data 112. The second request may correspond to the second request described with reference to FIG. 12, or to another request.

The method 1400 may further include accessing the logical-to-physical address mapping table to determine that the second data is to be stored at a second physical page of the memory, at 1428. The second physical page is disposed within the memory at a second distance from the substrate, and the second distance is greater than the first distance. The second physical page may correspond to the physical page 108.

The method 1400 may further include accessing the memory access parameter table to determine that the second physical page is included in a second set of one or more physical pages associated with a second write parameter, at 1432. The second write parameter may correspond to the parameter 158. In a particular embodiment, the parameter 158 specifies a second programming voltage that is different than the first programming voltage.

The method 1400 may further include adjusting the write circuitry based on the second write parameter, at 1436. For example, the controller 130 may assert one or more control signals that cause the read/write circuitry 106 to write data using the second programming voltage.

The method 1400 may further include writing the second data to the second physical page, at 1440. To illustrate, the data 112 may be written within the ECC codeword 110 to the physical page 108.

The method 1400 may improve accuracy of write operations at the data storage device 102. For example, because a variation of the structure 202 may increase a bit error rate of data stored at the physical page 108 relative to the physical page 118, data may be written to the physical pages 108, 118 using different techniques.

Figure 15:
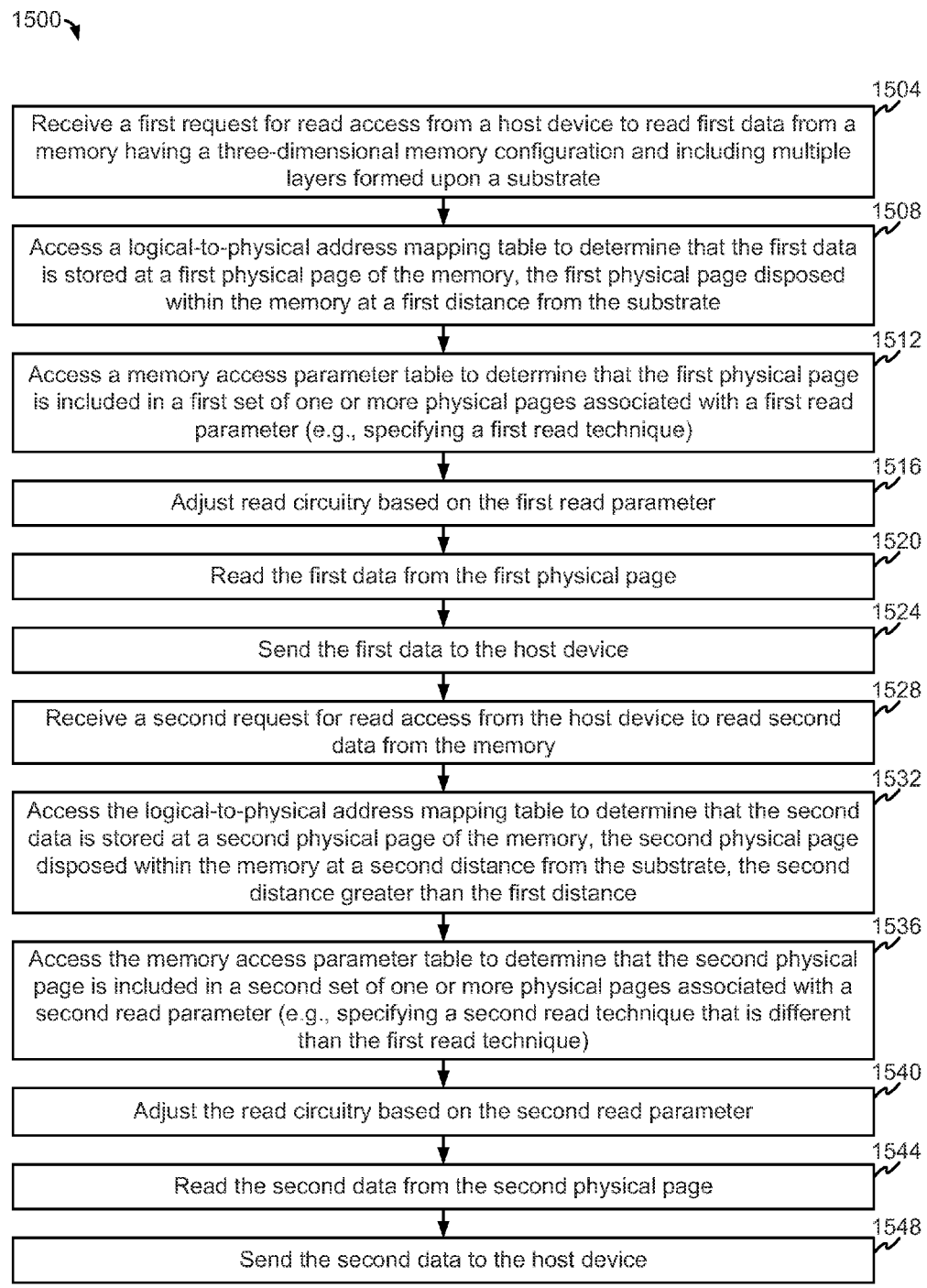

Referring to FIG. 15, a particular illustrative embodiment of a method is depicted and generally designated 1500. The method 1500 may be performed by the data storage device 102. For example, certain operations of the method 1500 may be performed by the controller 130, the read/write circuitry 106, or a combination thereof.

The method 1500 may include receiving a first request for read access from a host device to read first data from a memory having a three-dimensional memory configuration and including multiple layers formed upon a substrate, at 1504. The memory may correspond to the memory 104, and the host device may correspond to the host device 172. The substrate may correspond to the substrate 208, and the multiple layers may include the layers 210, 212, and 214. The first data may correspond to the data 122. The first request may correspond to the first request described with reference to FIG. 13, or to another request.

The method 1500 may further include accessing a logical-to-physical address mapping table to determine that the first data is stored at a first physical page of the memory, at 1508. The first physical page is disposed within the memory at a first distance from the substrate. The logical-to-physical address mapping table may correspond to the logical-to-physical address mapping table 166, and the first physical page may correspond to the physical page 118.

The method 1500 may further include accessing a memory access parameter table to determine that the first physical page is included in a first set of one or more physical pages associated with a first read parameter, at 1512. The memory access parameter table may correspond to the memory access parameter table 154, and the first read parameter may correspond to the parameter 156. In a particular embodiment, the parameter 156 specifies a first read voltage.

The method 1500 may further include adjusting read circuitry based on the first parameter, at 1516. For example, the controller 130 may assert one or more control signals that cause the read/write circuitry 106 to read data using the first read voltage.

The method 1500 may further include reading the first data from the first physical page, at 1520. To illustrate, the read/write circuitry 106 may sense the ECC codeword 120 from the physical page 118. In a particular embodiment, the ECC engine 132 decodes the ECC codeword 120 to generate the data 122.

The method 1500 may further include sending the first data to the host device, at 1524. To illustrate, the controller 130 may send the data 122 to the host device 172 via the host interface 170.

The method 1500 may further include receiving a second request for read access from the host device to read second data from the memory, at 1528. The second data may correspond to the data 112. The second request may correspond to the second request described with reference to FIG. 13, or to another request.

The method 1500 may further include accessing the logical-to-physical address mapping table to determine that the second data is stored at a second physical page of the memory, at 1532. The second physical page is disposed within the memory at a second distance from the substrate, and the second distance is greater than the first distance. The second physical page may correspond to the physical page 108.

The method 1500 may further include accessing the memory access parameter table to determine that the second physical page is included in a second set of one or more physical pages associated with a second read parameter, at 1536. The second read parameter may correspond to the parameter 158. In a particular embodiment, the parameter 158 specifies a second read voltage that is different than the first read voltage.

The method 1500 may further include adjusting the read circuitry based on the second read parameter, at 1540. For example, the controller 130 may assert one or more control signals that cause the read/write circuitry 106 to read data using the second read voltage.

The method 1500 may further include reading the data from the second physical page, at 1544. To illustrate, the read/write circuitry 106 may sense the ECC codeword 110 from the physical page 108. The ECC engine 132 may decode the ECC codeword 110 to generate the data 112.

The method 1500 may further include sending the second data to the host device, at 1548. For example, the controller 130 may send the data 112 to the host device 172 via the host interface 170.

The method 1500 may improve accuracy of read operations at the data storage device 102. For example, because a variation of the structure 202 may increase a bit error rate of data stored at the physical page 108 relative to the physical page 118, data may be read from the physical pages 108, 118 using different techniques.

Figure 16:
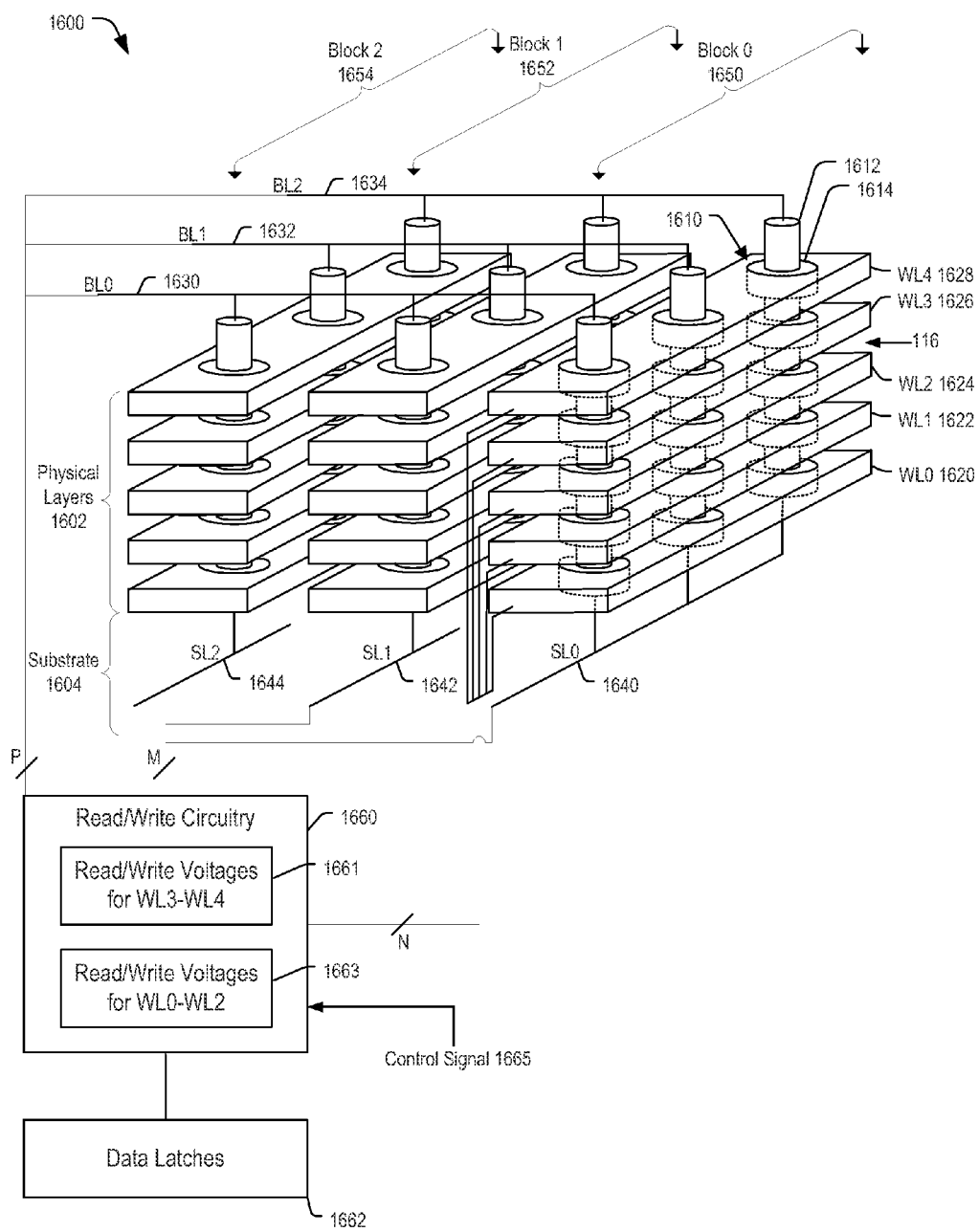
FIGS. 16 and 17 are block diagrams of particular embodiments of the memory of the data storage device of FIG. 1.

FIG. 16 illustrates an embodiment of a 3D memory 1600 in a NAND flash configuration. The 3D memory 1600 may correspond to the memory 104 of FIG. 1. The memory 1600 includes multiple physical layers 1602 that are monolithically formed above a substrate 1604, such as a silicon substrate. Storage elements (e.g., memory cells), such as a representative storage element 1610, are arranged in arrays in the physical layers 1602.

The representative memory cell 1610 includes a charge trap structure 1614 between a word line/control gate (WL4) 1628 and a conductive channel 1612. Charge may be injected into or drained from the charge trap structure 1614 via biasing of the conductive channel 1612 relative to the word line 1628. For example, the charge trap structure 1614 may include silicon nitride and may be separated from the word line 1628 and the conductive channel 1612 by a gate dielectric, such as a silicon oxide. An amount of charge in the charge trap structure 1614 affects an amount of current through the conductive channel 1612 during a read operation of the memory cell 1610 and indicates one or more bit values that are stored in the memory cell 1610.

The 3D memory 1600 includes multiple erase blocks, including a first block (block 0) 1650, a second block (block 1) 1652, and a third block (block 2) 1654. Each block 1650-1654 includes a "vertical slice" of the physical layers 1602 that includes a stack of word lines, illustrated as a first word line (WL0) 1620, a second word line (WL1) 1622, a third word line (WL2) 1624, a fourth word line (WL3) 1626, and the fifth word line (WL4) 1628. Multiple conductive channels (having a substantially vertical orientation (i.e., having an up and down orientation in FIG. 16) that is substantially perpendicular to an upper surface of the substrate 1604) extend through the stack of word lines. Each conductive channel is coupled to a storage element in each word line 1620-1628, forming a NAND string of storage elements. FIG. 16 illustrates three blocks 1650-1654, five word lines 1620-1628 in each block, and three conductive channels in each block for clarity of illustration. However, the 3D memory 1600 may have more than three blocks, more than five word lines per block, and more than three conductive channels per block.

The 3D memory further includes read/write circuitry 1660 and data latches 1662. The read/write circuitry 1660 may correspond to the read/write circuitry 106 of FIG. 1. The read/write circuitry 1660 is coupled to the conductive channels via multiple conductive lines, illustrated as a first bit line (BL0) 1630, a second bit line (BL1) 1632, and a third bit line (BL2) 1634 at a "top" end of the conducive channels (e.g., farther from the substrate 1604) and a first source line (SL0) 1640, a second source line (SL1) 1642, and a third source line (SL2) 1644) at a "bottom" end of the conductive channels (e.g., nearer to or within the substrate 1604). The read/write circuitry 1660 is illustrated as coupled to the bit lines 1630-1634 via "P" control lines, coupled to the source lines 1640-1644 via "M" control lines, and coupled to the word lines 1620-1628 via "N" control lines. Each of P, M, and N has a positive integer value based on the specific configuration of the 3D memory 1600. In the illustrative example of FIG. 16, P=3, M=3, and N=5.

In operation, data (e.g., an ECC codeword) may be latched into the data latches 1662 (e.g., by the controller 130 of FIG. 1) for writing to one of the word lines 1620-1628. To write data to one or more of the word lines 1620-1628, the read/write circuitry 1660 may read bits from the data latches 1662 and apply selection signals to control lines coupled to the word lines 1620-1628, the bit lines 1630-1634, and the source lines 1640-1642 to cause a programming voltage (e.g., a voltage pulse or series of voltage pulses) to be applied across selected storage element(s) of the selected word line (e.g., the fourth word line 1628).

The read/write circuitry 1660 may be responsive to a control signal 1665 (e.g., from the controller 130 of FIG. 1) to select between read/write voltages 1661 and read/write voltages 1663. The read/write voltages 1663 may include programming voltages for word lines of the 3D memory 1600 that are below the location 116. The read/write voltages 1661 may further include programming voltages for word lines of the 3D memory 1600 that are above the location 116. In the example of FIG. 16, the word lines 1620-1624 are below the location 116, and the word lines 1626, 1628 are above the location 116. Accordingly, based on the control signal 1665, the read/write circuitry 1660 may write data from the data latches 1662 to any of the word lines 1620-1624 using one or more programming voltages included in the read/write voltages 1663 or to any of the word lines 1626, 1628 using one or more programming voltages included in the read/write voltages 1661.

During a read operation, the controller 130 of FIG. 1 may receive a request from a host device, such as the host device 172 of FIG. 1. The controller 130 may cause the read/write circuitry 1660 to read bits from particular storage elements of the 3D memory 1600 by applying appropriate signals to the control lines to cause storage elements of a selected word line to be sensed. The logical values read from the storage elements of the selected word line may be saved at the data latches 1662 and provided to the controller 130.

The read/write circuitry 1660 may be responsive to the control signal 1665 to select a particular read voltage (or set of read voltages) of the read/write voltages 1661, 1663. The read/write voltages 1663 may include read voltages for word lines of the 3D memory 1600 that are below the location 116. The read/write voltages 1661 may further include read voltages for word lines of the 3D memory 1600 that are above the location 116. In the example of FIG. 16, the word lines 1620-1624 are below the location 116, and the word lines 1626, 1628 are above the location 116. Accordingly, based on the control signal 1665, the read/write circuitry 1660 may read data from any of the word lines 1620-1624 using read voltages included in the read/write voltages 1663 or from any of the word lines 1626, 1628 using read voltages included in the read/write voltages 1661. The data may be saved to the data latches 1662 to be accessed by the controller 130.

Figure 17:
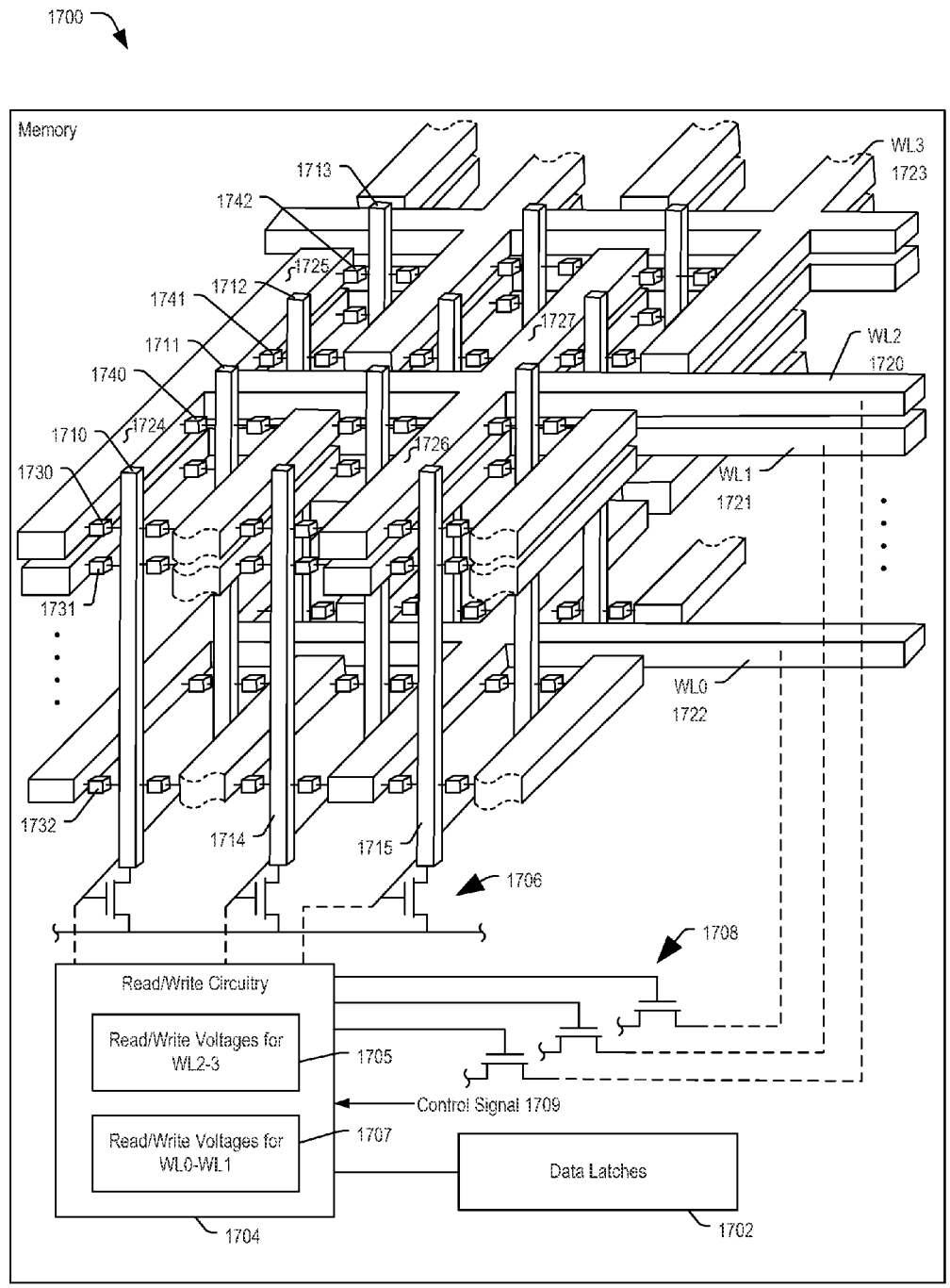

FIG. 17 is a diagram of a particular embodiment of a memory 1700. The memory may correspond to the memory 104 of FIG. 1. FIG. 17 illustrates a portion of a three-dimensional architecture of the memory 104 according to a particular embodiment. In the embodiment illustrated in FIG. 17, the memory 1700 is a vertical bit line Resistive Random Access Memory (ReRAM) with a plurality of conductive lines in physical layers over a substrate (e.g., substantially parallel to a surface of the substrate), such as representative wordlines 1720, 1721, 1722, and wordline 1723 (only a portion of which is shown in FIG. 17) and a plurality of vertical conductive lines through the physical layers, such as representative bit lines 1710, 1711, 1712, and 1713. The memory 1700 also includes a plurality of resistance-based storage elements (e.g., memory cells), such as representative storage elements 1730, 1731, 1732, 1740, 1741, and 1742, each of which is coupled to a bit line and a wordline in arrays of memory cells in multiple physical layers over the substrate (e.g., a silicon substrate).

The memory 1700 also includes data latches 1702 and read/write circuitry 1704. In a particular embodiment, the data latches 1702 corresponds to the data latches 1662 of FIG. 16 and the read/write circuitry 1704 corresponds to the read/write circuitry 106 of FIG. 1 and/or the read/write circuitry 1660 of FIG. 16. The read/write circuitry 1704 is coupled to wordline drivers 1708 and bit line drivers 1706.

In the embodiment illustrated in FIG. 17, each of the wordlines includes a plurality of fingers (e.g., a first wordline 1720 includes fingers 1724, 1725, 1726, and 1727). Each finger may be coupled to more than one bit line. To illustrate, a first finger 1724 of the first wordline 1720 is coupled to a first bit line 1710 via a first storage element 1730 at a first end of the first finger 1724 and is coupled to a second bit line 1711 via a second storage element 1740 at a second end of the first finger 1724.

In the embodiment illustrated in FIG. 17, each bit line may be coupled to more than one wordline. To illustrate, the first bit line 1710 is coupled to the first wordline 1720 via the first storage element 1730 and is coupled to a third wordline 1722 via a third storage element 1732.

During a write operation, the controller 130 may receive data from a host device, such as the host device 172 of FIG. 1. The controller 130 may send the data (or a representation of the data) to the memory 1700 to be stored in the data latches 1702. The controller 130 may encode the data (e.g., at the ECC engine 132) prior to sending the encoded data to the data latches 1702.

The read/write circuitry 1704 may read bits from the data latches 1702 and apply selection signals to selection control lines coupled to the wordline drivers 1708 and the bit line drivers 1706 to cause a write voltage to be applied across a selected storage element. For example, to select the first storage element 1730, the read/write circuitry 1704 may activate the wordline drivers 1708 and the bit line drivers 1706 to drive a programming current (also referred to as a write current) through the first storage element 1730. To illustrate, a first write current may be used to write a first logical value (e.g., a value corresponding to a high-resistance state) to the first storage element 1730, and a second write current may be used to write a second logical value (e.g., a value corresponding to a low-resistance state) to the first storage element 1730. The programming current may be applied by generating a programming voltage across the first storage element 1730 by applying a first voltage to the first bit line 1710 and to wordlines other than the first wordline 1720 and applying a second voltage to the first wordline 1720. In a particular embodiment, the first voltage is applied to other bit lines (e.g., the bit lines 1714, 1715) to reduce leakage current in the memory 104.

During a read operation, the controller 130 may receive a request from a host device, such as the host device 130 of FIG. 1. The controller 130 may cause the read/write circuitry 1704 to read bits from particular storage elements of the memory 104 by applying selection signals to selection control lines coupled to the wordline drivers 1708 and the bit line drivers 1706 to cause a read voltage to be applied across a selected storage element. For example, to select the first storage element 1730, the read/write circuitry 1704 may activate the wordline drivers 1708 and the bit line drivers 1706 to apply a first voltage (e.g., 0.7 volts (V)) to the first bit line 1710 and to wordlines other than the first wordline 1720. A lower voltage (e.g., 0 V) may be applied to the first wordline 1720. Thus, a read voltage is applied across the first storage element 1730, and a read current corresponding to the read voltage may be detected at a sense amplifier of the read/write circuitry 1704. The read current corresponds (via Ohm's law) to a resistance state of the first storage element 1730, which corresponds to a logical value stored at the first storage element 1730. The logical value read from the first storage element 1730 and other elements read during the read operation may be saved at the data latches 1702 and provided to the controller 130.

The example of FIG. 17 illustrates that the read/write circuitry may selectively apply read/write voltages 1707 for word lines 1721, 1722 and read/write voltages 1705 for word lines 1720, 1723. The read/write circuitry 1704 may selectively apply the read/write voltages 1705, 1707 based on a control signal 1709, which may be received from the controller 130 of FIG. 1. The controller 130 may selectively assert the control signal 1709 to adjust the read/write circuitry 1704. For example, the controller 130 may selectively assert the control signal 1709 to cause data to be programmed to and read from the word lines 1721, 1722 at different programming voltages and read voltages as compared to the word lines 1720, 1723.

As used herein, a variation of a structure may occur "approximately" at a location if the variation causes a performance difference between a first storage element on one side of the location (e.g., below the location) and a second storage element on another side of the location (e.g., above the location). To illustrate, a location of a variation of a structure (e.g., the location 116) may be approximately between the storage elements 204, 206 if the variation causes a performance difference between the storage elements 204, 206. The performance difference may correspond to a difference in a number of programming pulses used to program the storage element 204 to a particular state relative to the storage element 206, as an illustrative example. It is noted that the location of the variation need not be exactly located between the storage elements 204, 206 to cause a performance difference between the storage elements 204, 206. As used herein, a location may be "associated with" a variation of a structure if the variation occurs approximately at the location.

It is noted that the particular examples herein are provided for illustrative purposes and that certain modifications of the examples are within the scope of the disclosure. For example, although FIG. 5 illustrates that the 3D memory 500 includes a single level (the level 502), the 3D memory 500 may include multiple levels. For example, depending on the particular fabrication process, the 3D memory 500 may multiple different variations (e.g., "taper" effects) of one or more structures extending through layers of the 3D memory 500. In this case, the 3D memory 500 may include multiple levels associated with multiple subsets of physical pages. Each of the subsets may be associated with a particular encoding technique, writing technique, reading technique, and/or decoding technique.

Depending on the particular fabrication process, a variation of a structure may have one or more of a variety of shapes. The structure 202 is illustrated as having a "conical" or "tapered" shape for illustration. However, a structure may have another shape. For example, depending on the particular fabrication process, a structure of a memory may increase in uniformity (e.g., tapering may decrease) with increased distance from a surface of a substrate of the memory. In this case, reliability of first data stored at a first set of one or more physical pages of the memory nearer the substrate may be less than reliability of second data stored at a second set of one or more physical pages of the memory that are farther from the substrate. The data storage device 102 may be configured to compensate for reduced reliability of the first data. For example, the data storage device 102 may apply the second encoding technique of FIG. 12, the second decoding technique of FIG. 13, the second write technique of FIG. 14, and/or the second read technique of FIG. 15 to the first data to compensate for reduced reliability of the first data. In this example, the data storage device 102 may apply the first encoding technique of FIG. 12, the first decoding technique of FIG. 13, the first write technique of FIG. 14, and/or the first read technique of FIG. 15 to the second data.

It is further noted that levels of a memory may be defined separately for different parameters of the memory. To illustrate, the level 502 of the 3D memory 500 may define a first encoding technique for a first set of one or more physical pages of the 3D memory 500 above the location 116 and may further define a second encoding technique for a second set of one or more physical pages of the 3D memory 500 below the location 116. A second level of the 3D memory 500 may define a first write technique for a third set of one or more physical pages of the 3D memory 500 that are below the second level and may further define a second write technique for a fourth set of one or more physical pages of the 3D memory 500 that are above the second level. A third level of the 3D memory 500 may define a first read technique for a fifth set of one or more physical pages of the 3D memory 500 that are below the third level and may further define a second read technique for a sixth set of one or more physical pages of the 3D memory 500 that are above the third level. A fourth level of the 3D memory 500 may define a first decoding technique for a seventh set of one or more physical pages of the 3D memory 500 that are above the fourth level and may further define a second write technique for an eighth set of one or more physical pages of the 3D memory 500 that are above the fourth level.

In a particular illustrative embodiment, the location identifier 134 stores indications of storage elements (e.g., the first storage element and the second storage element described with reference to FIG. 1) and measured parameters associated with the storage elements (e.g., the first parameter and the second parameter described with reference to FIG. 1) within the measurements 142. In this case, the location identifier 134 may "track" one or more locations of variations associated with the memory 104. For example, due to physical wear and/or other effects, physical characteristics of the memory 104 may change over an operating life of the data storage device 102, which may add or change locations of variations to the memory 104. Alternatively or in addition, the location identifier 134 may randomly or pseudo-randomly select storage elements of the memory 104 for measurements. Alternatively or in addition, the location identifier 134 may initially measure parameters for a set of storage elements that includes the first storage element and the second storage element. During one or more subsequent measurement (or "calibration") operations, the location identifier 134 may "add" additional storage elements of the memory 104 to the set of storage elements and may measure parameters of the additional storage elements (e.g., to increase accuracy of measurement operations as physical wear accrues at the data storage device 102 due to operation of the data storage device 102).

It should be appreciated that in some cases operations described herein as being performed by the data storage device 102 can be performed by another device, such as a design computer, fabrication equipment, etc. To illustrate, although FIG. 1 describes that the controller 130 may generate the information 146, it should be appreciated that the information 146 may be generated externally to the data storage device 102 and loaded to the data storage device 102 (e.g., via the host interface 170). As an example, the information 146 may be loaded to the data storage device 102 via a firmware update. Alternatively or in addition, the information 146 may be "hard coded" into the data storage device 102, such as by fabricating the data storage device 102 with hardware and/or instructions based on the information 146.

Although certain structures and operations have been described in combination for convenience of illustration, certain structures and operations may be implemented separately. For example, depending on the particular implementation, the information 146 may be loaded to the controller 130 from an external device, and the location identifier 134 may be omitted from the data storage device 102. Alternatively or in addition, one or more of the ECC parameter table 148 or the memory access parameter table 154 may be omitted from the data storage device 102.

Although one or more components described herein are illustrated as block components and described in general terms, such components may include one or more microprocessors, state machines, and/or other circuits configured to enable the data storage device 102 (or one or more components thereof) to perform operations described herein. One or more components described herein may be coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. As an illustrative example, the power-up indicator 136 may include a state machine configured to store a value that is adjustable by the controller 130 in response to a power-up event at the data storage device 102.

Alternatively or in addition, or more aspects of the data storage device 102 may be implemented using a microprocessor or microcontroller programmed (e.g., by executing instructions) to perform operations described herein, such as one or more operations of the methods 700-1500. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). One or more operations described herein as being performed by the controller 130 may be performed at the memory 104 (e.g., "in-memory" ECC decoding, as an illustrative example) alternatively or in addition to performing such operations at the controller 130.

To further illustrate, the controller 130 may include a processor that is configured to execute instructions to perform certain operations (e.g., an algorithm) described herein. The instructions may include general purpose instructions, and the processor may include a general purpose execution unit operable to execute general purpose instructions. The processor may access the instructions from the memory 104, the RAM 144, another memory location, or a combination thereof. The processor may execute the instructions to access information that is stored at the data storage device 102, where the information identifies a location associated with a variation of the structure. As an illustrative example, the processor may execute the instructions to access the information 146 from the memory 104 by sending a read command to the memory 104. The information may be saved at data latches of the memory 104 (e.g., the data latches 1662 and/or the data latches 1702) and then loaded to the RAM 144. Alternatively or in addition, the processor may execute the instructions to perform one or more other operations described herein.

The data storage device 102 may be attached to or embedded within one or more host devices, such as within a housing of a host communication device (e.g., the host device 172). For example, the data storage device 102 may be integrated within a packaged apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 172.

To further illustrate, the data storage device 102 may be configured to be coupled to the host device 172 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a memory having a three-dimensional (3D) memory configuration, performing:
      encoding first data to be stored at a first physical page that is disposed within the memory at a first distance from a substrate of the memory, wherein the first data is encoded using a first encoding technique; and
      encoding second data to be stored at a second physical page that is disposed within the memory at a second distance from the substrate, wherein the second distance is greater than the first distance, and wherein the second data is encoded using a second encoding technique that is different than the first encoding technique.

2. The method of claim 1, further comprising storing an error correcting code (ECC) parameter table at the data storage device, wherein the ECC parameter table indicates a first ECC parameter for a first set of one or more physical pages of the memory and further indicates a second ECC parameter for a second set of one or more physical pages of the memory.

3. The method of claim 2, wherein the distance defines a location, wherein the first set is disposed below the location, wherein the second set is disposed above the location, and wherein the location is associated with a variation in a structure of the memory that extends through multiple layers of the memory.

4. The method of claim 2, further comprising:
   prior to encoding the first data and the second data, accessing a logical-to-physical address mapping table to determine that the first data is to be stored at the first physical page and that the second data is to be stored at the second physical page; and
   in response to determining that the first data is to be stored at the first physical page and that the second data is to be stored at the second physical page, accessing the ECC parameter table to determine that the first data is to be encoded using the first encoding technique and that the second data is to be encoded using the second encoding technique.

5. The method of claim 4, further comprising changing a mode of operation of an ECC engine of the data storage device from using the first encoding technique to the second encoding technique prior to encoding the second data and in response to determining that the second data is to be stored at the second physical page.

6. The method of claim 1, wherein encoding the first data generates a first error correcting code (ECC) codeword, wherein encoding the second data generates a second ECC codeword, and further comprising:
  storing the first ECC codeword at the first physical page; and
  storing the second ECC codeword at the second physical page.

7. The method of claim 6, further comprising:
receiving one or more requests from a host device for read access to the first data and to the second data; and
in response to the one or more requests:
  sensing the first ECC codeword from the first physical page; and
  sensing the second ECC codeword from the second physical page.

8. The method of claim 7, further comprising:
decoding the first ECC codeword using a first decoding technique to generate the first data; and
decoding the second ECC codeword to generate the second data using a second decoding technique that is different than the first decoding technique.

9. The method of claim 8, further comprising:
prior to decoding the first data and the second data, accessing a logical-to-physical address mapping table to determine that the first data is stored at the first physical page and that the second data is stored at the second physical page; and
accessing an ECC parameter table to determine that the first ECC codeword is to be decoded using a first decoding technique and that the second data is to be decoded using a second decoding technique.

10. The method of claim 9, further comprising changing a mode of operation of an ECC engine of the data storage device from using the first decoding technique to the second decoding technique prior to decoding the second data and in response to determining that the second data is to be decoded using the second decoding technique.

11. The method of claim 6, wherein the first ECC codeword has a first number of ECC bits, and wherein the second ECC codeword has a second number of ECC bits that is greater than the first number of ECC bits.

12. The method of claim 1, wherein the first encoding technique is a polynomial-based encoding technique, and where the second encoding technique is a probabilistic-based encoding technique.

13. The method of claim 1, wherein the first encoding technique includes a Bose-Chaudhuri-Hocquenghem (BCH) encoding technique, and wherein the second encoding technique includes one of a low-density parity check (LDPC) technique or a turbo coding technique.

14. The method of claim 1, wherein the data storage device further includes a controller that is operationally coupled to the memory, and wherein the controller encodes the first data and the second data.

15. The method of claim 1, wherein the memory is a non-volatile memory that is monolithically formed in one or more physical levels of arrays of memory cells having an active area disposed above a silicon substrate, and wherein the data storage device further includes circuitry associated with operation of the memory cells.

16. A data storage device comprising:
a memory having a three-dimensional (3D) memory configuration, wherein the memory includes a substrate, a first physical page that is disposed within the memory at a first distance from the substrate, and a second physical page that is disposed within the memory at a second distance from the substrate, wherein the second distance is greater than the first distance; and
a controller coupled to the memory, wherein the controller is configured to encode first data to be stored at the first physical page using a first encoding technique, and wherein the controller is further configured to encode second data to be stored at the second physical page using a second encoding technique that is different than the first encoding technique.

17. The data storage device of claim 16, wherein an error correcting code (ECC) parameter table is stored at the memory, and wherein the ECC parameter table indicates a first ECC parameter for a first set of one or more physical pages of the memory and further indicating a second ECC parameter for a second set of one or more physical pages of the memory.

18. The data storage device of claim 17, wherein the distance defines a location, wherein the first set is disposed below the location, wherein the second set is disposed above the location, and wherein the location is associated with a variation in a structure of the memory that extends through multiple layers of the memory.

19. The data storage device of claim 17, wherein the controller is further configured to access a logical-to-physical address mapping table to determine that the first data is to be stored at the first physical page and that the second data is to be stored at the second physical page and to further determine that the first data is to be encoded using the first encoding technique and that the second data is to be encoded using the second encoding technique.

20. The data storage device of claim 16, wherein the memory is a non-volatile memory that is monolithically formed in one or more physical levels of arrays of memory cells having an active area disposed above a silicon substrate, and further comprising circuitry associated with operation of the memory cells.

* * * * *